(12) United States Patent
Kanatzidis et al.

(10) Patent No.: US 9,966,198 B2
(45) Date of Patent: May 8, 2018

(54) SOLAR CELLS WITH PEROVSKITE-BASED LIGHT SENSITIZATION LAYERS

(71) Applicant: Northwestern University, Evanston, IL (US)

(72) Inventors: Mercouri G. Kanatzidis, Wilmette, IL (US); Robert P. H. Chang, Glenview, IL (US); Konstantinos Stoumpos, Chicago, IL (US); Byunghong Lee, Evanston, IL (US)

(73) Assignee: Northwestern University, Evanston, IL (US)

( * ) Notice: Subject to any disclaimer, the term of this patent is extended or adjusted under 35 U.S.C. 154(b) by 0 days. days.

(21) Appl. No.: 14/695,273

(22) Filed: Apr. 24, 2015

(65) Prior Publication Data

US 2016/0211083 A1    Jul. 21, 2016

Related U.S. Application Data

(60) Provisional application No. 61/983,794, filed on Apr. 24, 2014, provisional application No. 62/136,087, filed on Mar. 20, 2015.

(51) Int. Cl.

| | |
|---|---|
| *B05D 5/12* | (2006.01) |
| *H01G 9/20* | (2006.01) |
| *H01L 31/032* | (2006.01) |
| *H01L 51/42* | (2006.01) |
| *H01G 9/00* | (2006.01) |

(52) U.S. Cl.
CPC ......... *H01G 9/2027* (2013.01); *H01G 9/0029* (2013.01); *H01G 9/2059* (2013.01); *H01L 31/032* (2013.01); *H01L 51/4226* (2013.01); Y02E 10/549 (2013.01)

(58) Field of Classification Search
CPC combination set(s) only.
See application file for complete search history.

(56) References Cited

U.S. PATENT DOCUMENTS

| | | | |
|---|---|---|---|
| 3,580,748 A | 5/1971 | DeLong | |
| 5,882,548 A | 3/1999 | Liang et al. | |
| 6,880,746 B2 | 4/2005 | Seseke-Koyro et al. | |
| 7,641,815 B2 | 1/2010 | Varadarajan et al. | |
| 8,529,797 B2 | 9/2013 | Shum | |
| 2002/0036298 A1 | 3/2002 | Nelles et al. | |
| 2002/0153510 A1 | 10/2002 | Sun et al. | |
| 2005/0109385 A1 | 5/2005 | Kim et al. | |
| 2007/0085051 A1 | 4/2007 | Sohn et al. | |
| 2008/0014463 A1 | 1/2008 | Varadarajan et al. | |
| 2008/0038494 A1 | 2/2008 | Midgley et al. | |
| 2008/0202583 A1 | 8/2008 | Lee | |
| 2009/0095341 A1 | 4/2009 | Pfenninger et al. | |
| 2009/0126784 A1* | 5/2009 | Pak | H01G 9/2031 136/256 |
| 2009/0211638 A1 | 8/2009 | Park et al. | |
| 2010/0032018 A1 | 2/2010 | Zhu et al. | |
| 2010/0051101 A1 | 3/2010 | Kim et al. | |
| 2010/0055350 A1 | 3/2010 | Pfenninger et al. | |
| 2010/0316331 A1 | 12/2010 | Kenney et al. | |
| 2011/0180757 A1 | 7/2011 | Vockic et al. | |
| 2011/0284072 A1 | 11/2011 | Takayasu | |
| 2012/0031483 A1* | 2/2012 | Obana | H01G 9/2031 136/256 |
| 2012/0048357 A1* | 3/2012 | Hayase | H01G 9/2031 136/255 |
| 2012/0146007 A1 | 6/2012 | Snaith | |
| 2012/0305918 A1 | 12/2012 | Shum | |
| 2012/0306053 A1 | 12/2012 | Shum et al. | |
| 2013/0139872 A1 | 6/2013 | Shum et al. | |
| 2013/0233377 A1 | 9/2013 | Kanatzidis et al. | |
| 2013/0319529 A1 | 12/2013 | Tsuda et al. | |
| 2013/0320836 A1 | 12/2013 | Kanatzidis et al. | |

(Continued)

FOREIGN PATENT DOCUMENTS

| | | |
|---|---|---|
| EP | 1176618 B1 | 2/2004 |
| EP | 2280404 A2 | 2/2011 |

(Continued)

OTHER PUBLICATIONS

Lee et al. "Air-Stable Molecular Semiconducting Iodosalts for Solar Cell applications: Cs2SnI6 as a hole conductor" (Aug. 2014).*
Stoumpos et al. "Semiconducting Tin and Lead Iodide Perovskite with Organic Cations: Phase Transition, High Mobilities, and Near-Infrared Photoluminescent Properties" (Jul. 2013).*
Non-Final Office Action dated Mar. 1, 2016, for U.S. Appl. No. 13/772,794, 22 pages.
Papavassiliou et al., Excitonic Bands in the Photoconductivity Spectra of Some Organic-Inorganic Hybrid Compounds Based on Metal Halide Units, International Journal of Modern Physics B, vol. 15, Nos. 28, 29 & 30, 2001, pp. 3727-3731.
Shum et al., Synthesis and characterization of CsSnI3 thin films, Applied Physics Letters, vol. 96, No. 221903, Jun. 2, 2010, pp. 1-3.
International Search Report and Written Opinion issued in PCT/US2013/026827, dated Jun. 14, 2013.

(Continued)

*Primary Examiner* — Austin Murata
(74) *Attorney, Agent, or Firm* — Bell & Manning, LLC

(57) ABSTRACT

Solar cells are provided which comprise an electron transporting layer and a light sensitizing layer of perovskite disposed over the surface of the electron transporting layer. The perovskite may have a formula selected from the group consisting of $A_2MX_6$, $Z_2MX_6$ or $YMX_6$, wherein A is an alkali metal, M is a metal or a metalloid, X is a halide, Z is selected from the group consisting of a primary ammonium, an iminium, a secondary ammonium, a tertiary ammonium, and a quaternary ammonium, and Y has formula $M_b(L)_3$, wherein $M_b$ is a transition metal in the 2+ oxidation state L is an N—N neutral chelating ligand. Methods of making the solar cells are also provided, including methods based on electrospray deposition.

20 Claims, 30 Drawing Sheets

(56) References Cited

U.S. PATENT DOCUMENTS

| | | | |
|---|---|---|---|
| 2015/0136232 A1 | 5/2015 | Snaith et al. | |
| 2015/0144196 A1* | 5/2015 | Irwin | H01G 9/2027 |
| | | | 136/261 |
| 2015/0249170 A1* | 9/2015 | Snaith | H01L 51/422 |
| | | | 136/256 |
| 2015/0295194 A1 | 10/2015 | Kanatzidis et al. | |
| 2015/0340632 A1* | 11/2015 | Etgar | H01L 51/4226 |
| | | | 136/255 |

FOREIGN PATENT DOCUMENTS

| | | |
|---|---|---|
| EP | 2693503 | 2/2014 |
| GB | 957191 | 5/1964 |
| JP | 5-279009 | 10/1993 |
| JP | 2003142168 | 5/2003 |
| KR | 10-20080079894 | 9/2008 |
| KR | 10-20110066382 | 6/2011 |
| WO | WO 2013-129097 | 9/2013 |
| WO | WO 2013-171518 | 11/2013 |
| WO | WO 2013-171520 | 11/2013 |
| WO | WO2013171517 | 11/2013 |

OTHER PUBLICATIONS

International Search Report and Written Opinion issued in PCT/US2013/027087, dated Jun. 21, 2013.
International Search Report and Written Opinion dated Jul. 14, 2015 for Intl. Patent Appl. No. PCT/US2015/025802, 11 pp.
International Search Report and Written Opinion dated Jul. 23, 2015, for Intl. Patent Appl. No. PCT/US2015/027501, 12 pp.
Non-Final Office Action for U.S. Appl. No. 13/771,309, dated Mar. 11, 2015, 12 pp.
Non-Final Office Action for U.S. Appl. No. 13/771,309, dated Jun. 18, 2014, 11 pp.
Yamada et al., Structure and Bonding of Two Modifications of CsSnI3 by Means of Powder X-Ray Diffraction, 1271 NQR, and DTA, Chemistry Letters, 1989, pp. 1325-1328.
Yamada et al., Structural Phase Transitions of the Polymorphs of CsSnI3 by Means of Rietveld Analysis of the X-Ray Diffraction, Chemistry Letters, 1991, pp. 801-804.
Trots et al., High-temperature structural evolution of caesium and rubidium triiodoplumbates, Journal of Physics and Chemistry of Solids, vol. 69, 2008, pp. 2520-2526.
Takahashi et al., Charge-transport in tin-iodide perovskite CH3NH3SnI3: origin of high conductivity, Dalton Transactions, vol. 40, Apr. 14, 2011, pp. 5563-5568.
Yamada et al., Tunable Perovskite Semiconductor CH3NH3SnX3 (X: Cl, Br, or I) Characterized by X-ray and DTA, Bull. Chem. Soc. Jpn., vol. 84, No. 9, Aug. 27, 2011, pp. 926-932.
Papavassiliou et al., Structural, optical and related properties of some natural three- and lower-dimensional semiconductor systems, Synthetic Metals, vol. 71, 1995, pp. 1713-1714.
D. Mitzi, Synthesis, Crystal Structure, and Optical and Thermal Properties of (C4H9NH3)2MI4 (M = Ge, Sn, Pb), Chem. Mater., vol. 8, 1996, pp. 791-800.
Xu, et aL, "Molecular Motions and Phase Transitions in Solid $CH_3NH_3PbX_3$ (X=Cl, Br, I) as Studied by NMR and NQR, Z.," Naturforsch, vol. 46a, 1991, pp. 240-246.
Kojima et al., Novel Photoelectrochemical Cell with Mesoscopic Electrodes Sensitized by Lead-halide Compounds (11), 214th ECS Meeting, Abstract #27, The Electrochemical Society, October 13, 2008.
Li et al., Photoconductive Properties of Organic-Inorganic Hybrid Perovskite $(C_6H_{13}NH_3)_2(CH_3NH_3)_{m-1}Pb_mI_{3m+1}$ :$TiO_2$ Nanocomposites Device Structure, Materials Letters, vol. 64, 2010, pp. 2735-2737.
G.C. Papavassiliou, Three- and Low-Dimensional Inorganic Semiconductors, Prog. Solid St. Chem., vol. 25, 1997, pp. 125-270.
Billing et al., Inorganic-organic hybrid materials incorporating primary cyclic ammonium cations: The lead bromide and chloride series, CrystEngComm, vol. 11, May 18, 2009, pp. 1549-1562.
Mercier et al., Structural diversity and retro-crystal engineering analysis of iodometalate hybrids, CrystEngComm, vol. 11, 2009, pp. 720-734.
Wu et al., Structural overview and structure-property relationships of iodoplumbate and iodobismuthate, Coordination Chemistry Reviews, vol. 253, Aug. 12, 2009, pp. 2787-2804.
Mitzi et al., Conducting tin halides with a layered organic-based perovskite structure, Nature, vol. 369, Jun. 9, 1994, pp. 467-469.
Mitzi et al., Transport, Optical, and Magnetic Properties of the Conducting Halide Perovskite CH3NH3SnI3, Journal of Solid State Chemistry, vol. 114, 1995, pp. 159-163.
Mitzi et al., Synthesis, Resistivity, and Thermal Properties of the Cubic Perovskite NH2CH5NH2SnI3 and Related Systems, Journal of Solid State Chemistry, vol. 134, 1997, pp. 376-381.
Calabrese et al., Preparation and Characterization of Layered Lead Halide Compounds, J. Am. Chem. Soc., vol. 113, 1991, pp. 2328-2330.
Chung et al., CsSnI3: Semiconductor or Metal? High Electrical Conductivity and Strong Near-Infrared Photoluminescence from a Single Material. High Hole Mobility and Phase-Transitions, J. Am. Chem. Soc., vol. 134, May 11, 2012, pp. 8579-8587.
Tanaka et al., Comparative study on the excitons in lead-halide-based perovskite-type crystals CH3NH3PbBr3 CH3NH3PbI3, Solid State Communications, vol. 127, 2003, pp. 619-623.
Im et al., 6.5% efficient perovskite quantum-dot-sensitized solar cell, Nanoscale, vol. 3, Sep. 7, 2011, pp. 4088-4093.
Chung et al., All-solid-state dye-sensitized solar cells with high efficiency, Nature, vol. 485, May 24, 2012, pp. 486-490.
Etgar et al., Mesoscopic CH3NH3PbI3/TiO2 Heterojunction Solar Cells, J. Am. Chem. Soc., vol. 134, Oct. 8, 2012, pp. 17396-17399.
Lee et al., Efficient Hybrid Solar Cells Based on Meso-Superstructured Organometal Halide Perovskites, Science, vol. 338, Nov. 2, 2012, pp. 643-647.
Scaife et al., Crystal Preparation and Properties of Cesium Tin(II) Trihalides, Journal of Solid State Chemistry, vol. 9, 1974, pp. 308-314.
Yu et al., Temperature dependence of the band gap of perovskite semiconductor compound CsSnI3, Journal of Applied Physics, vol. 110, No. 063526, Sep. 27, 2011, pp. 1-5.
Chen et al., Photoluminescence study of polycrystalline CsSnI3 thin films:Determination of exciton binding energy, Journal of Luminescence, vol. 132, Sep. 10, 2011, pp. 345-349.
Poglitsch et al., Dynamic disorder in methylammoniumtrihalogenoplumbates (II) observed by millimeterwave spectroscopy, J. Chem. Phys., vol. 87, 1987, pp. 6373-6378.
Onoda-Yamamuro et al., p-T Phase Relations of CH3NH3PbX3 (X=Cl, Br, I) Crystals, J. Phys. Chem. Solids, vol. 53, No. 2, 1992, pp. 277-281.
Howie et al., The Crystal Structure of Tin(II) Iodide, Acta Crystallographica, Sect. B, vol. 28, 1972, pp. 2965-2971.
G. Sheldrick, A short history of SHELX, Acta Crystallographica, Sect. A, vol. 64, 2008, pp. 112-122.
Howard et al., Group-Theoretical Analysis of Octahedral Tilting in Perovskites, Acta Crystallographica, Sect. B, vol. 54, 1998, pp. 782-789.
Howard et al., Octahedral tilting in cation-ordered perovskites—a group-theoretical analysis, Acta Crystallographica, Sect. B, vol. 60, 2004, pp. 674-684.
Howard et al., Structures and phase transitions in perovskites—a group-theoretical approach, Acta Crystallographica, Sect. A, vol. 61, 2005, pp. 93-111.
Swainson et al., Orientational ordering, tilting and lone-pair activity in the perovskite methylammonium tin bromide, CH3NH3SnBr3, Acta Crystallographica, Sect. B, vol. 66, 2010, pp. 422-429.
Borriello et al., Ab initio investigation of hybrid organic-inorganic perovskites based on tin halides, Physical Review B, vol. 77, No. 235214, Jun. 23, 2008, pp. 1-9.
Kojima et al., Organometal Halide Perovskites as Visible-Light Sensitizers for Photovoltaic Cells, J. Am. Chem. Soc., vol. 131, 2009, pp. 6050-6051.
M. Gratzel, Recent Advances in Sensitized Mesoscopic Solar Cells, Accounts of Chemical Research, vol. 42, No. 11, Nov. 2009, pp. 1788-1798.

(56) References Cited

OTHER PUBLICATIONS

Yanagida et al., Iodine/Iodide-Free Dye-Sensitized Solar Cells, Accounts of Chemical Research, vol. 42, No. 11, Nov. 2009, pp. 1827-1838.

Wang et al., An organic redox electrolyte to rival triiodide/iodide in dye-sensitized solar cells, Nature Chemistry, vol. 2, Apr. 4, 2010, pp. 385-389.

Mitzi et al., Conducting Layered Organic-Inorganic Halides Containing (110)-Oriented Perovskite Sheets, Science, vol. 267, Mar. 10, 1995, pp. 1473-1476.

Supporting Information for Stoumpos, Constantinos C., et al., Semiconducting Tin and Lead Iodide Perovskites with Organic Cations: Phase Transitions, High Mobilities and Near-infrared Photoluminescent Properties, Inorg. Chem. 52(15), Jul. 8, 2013, pp. 9019-9038.

\* cited by examiner

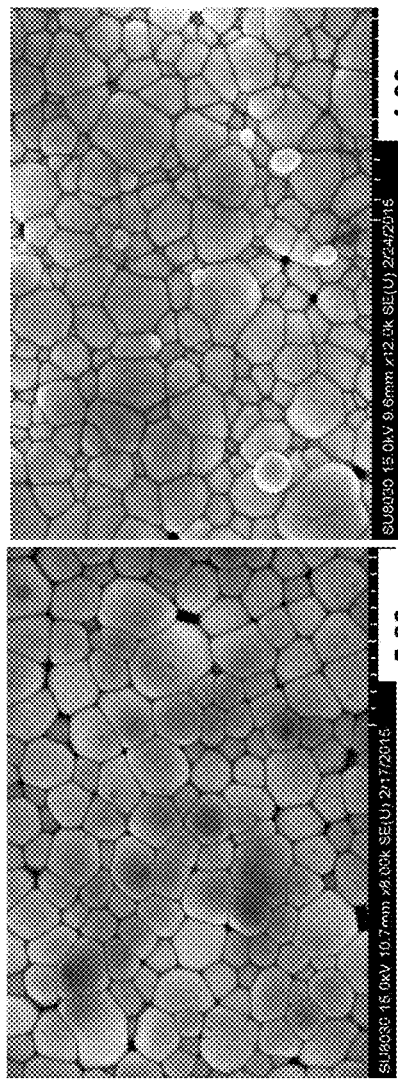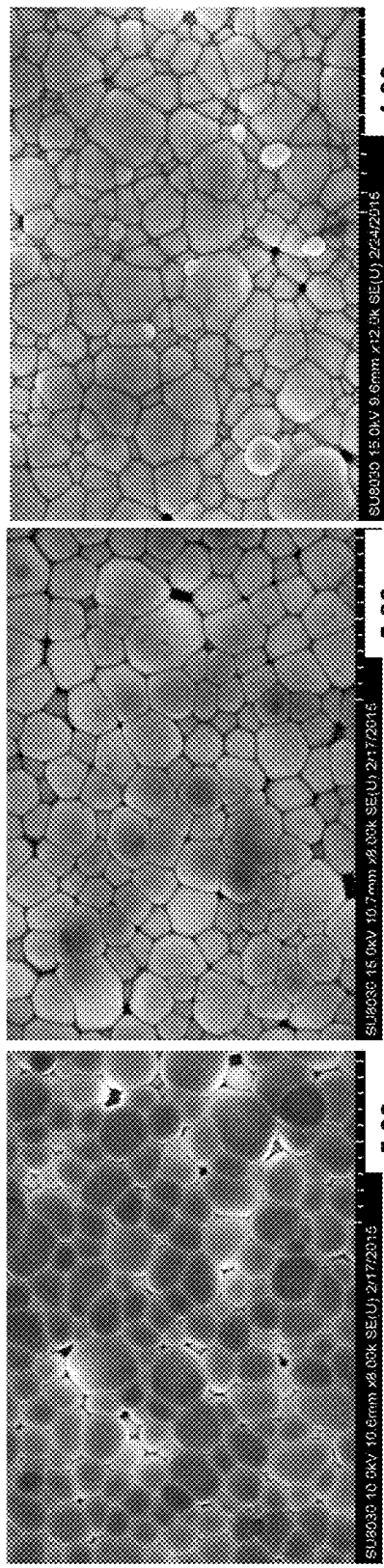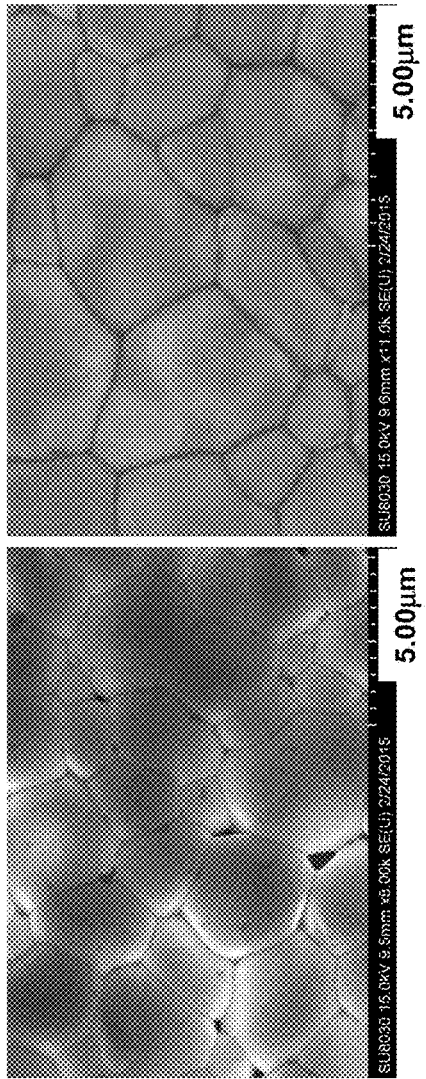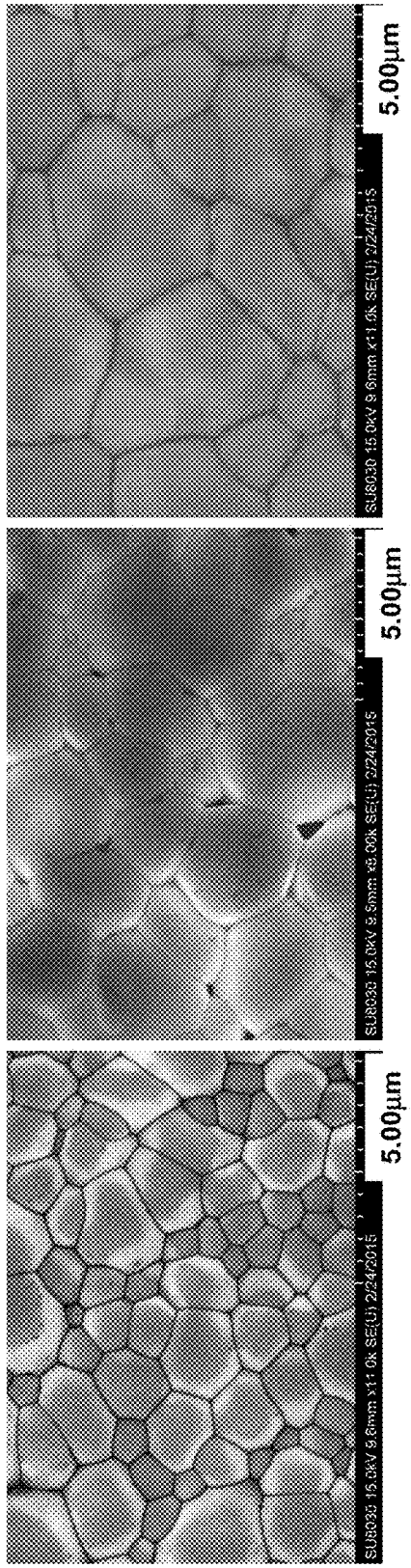

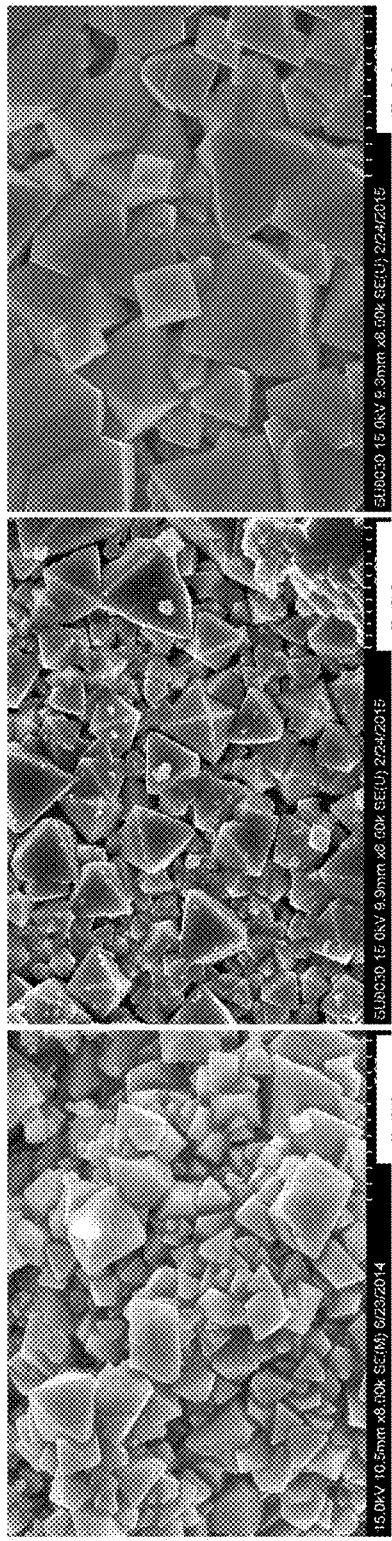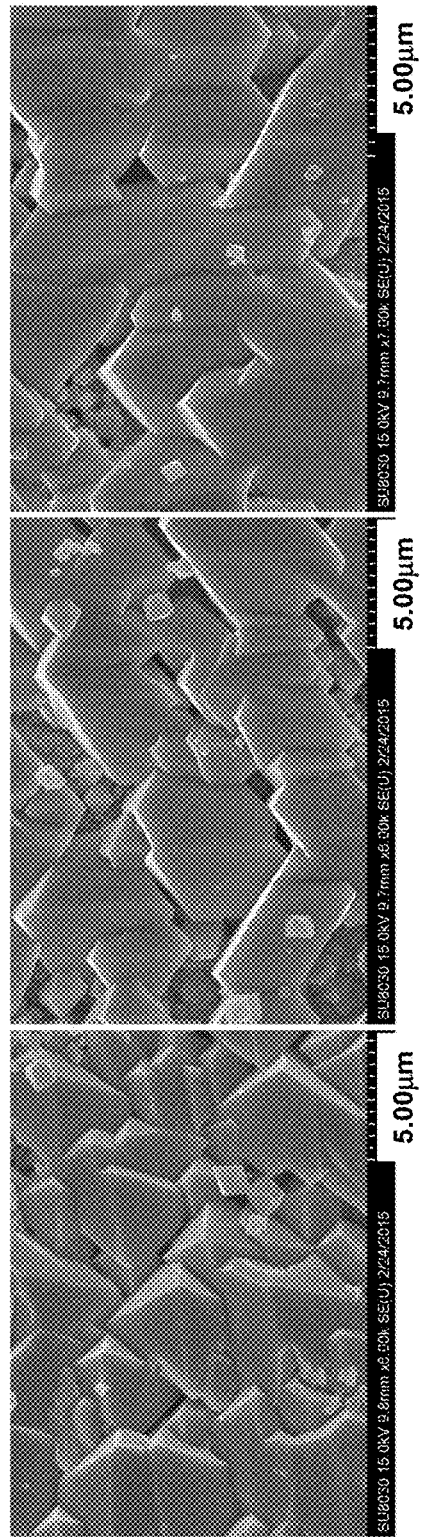
FIG. 17A  FIG. 17B  FIG. 17C  FIG. 17D  FIG. 17E  FIG. 17F

SOLAR CELLS WITH PEROVSKITE-BASED LIGHT SENSITIZATION LAYERS

CROSS-REFERENCE TO RELATED APPLICATIONS

The present application claims priority to U.S. Provisional Patent Application No. 61/983,794 filed Apr. 24, 2014, and to U.S. Provisional Patent Application No. 62/136,087, filed Mar. 20, 2015, the entire contents of which are hereby incorporated by reference.

REFERENCE TO GOVERNMENT RIGHTS

This invention was made with government support under grant number DE-SC0001059 awarded by the Department of Energy. The government has certain rights in the invention.

BACKGROUND

Intense research has been dedicated in recent years to replace fossil fuel and meet the increasing energy needs of modern society. One of the most prominent sources of renewable energy is solar energy which makes use of the virtually inexhaustible energy source, the sun. Photovoltaic research has been growing rapidly in search of inexpensive and environmentally friendly energy conversion and storage systems. Historically, conventional photovoltaics have been expensive due to the complex fabrication procedures and/or high price of raw materials some of which consist of toxic elements. These obstacles have motivated a burgeoning field of research in solar technologies fabricated from fundamentally low-cost materials employing inexpensive fabrication methods.

There has been a recent surge of interest in the solar cell community on the use of perovskites compounds for solar cell device fabrication. In particular, the $AMX_3$ lead based compounds, such as $CH_3NH_3PbI_3$, have demonstrated cell efficiencies new 20%. This is a major breakthrough in terms of the so-called $3^{rd}$ generation cell development.

SUMMARY

Provided are solar cells comprising perovskite light sensitizing layers and methods of making the solar cells.

At least some embodiments of the disclosed solar cells and methods exhibit one or more advantages over conventional solar cells comprising perovskites. By way of illustration, by eliminating lead (e.g., using Sn instead of Pb), at least some embodiments of the disclosed solar cells are less toxic and more environmentally safe. By using a metal or a metalloid in the +4 oxidation state (e.g., $Sn4^+$), at least some embodiments of the disclosed solar cells exhibit significantly greater long term stability, even in a moisture environment. By using an electrospray process, at least some embodiments of the disclosed methods allow for large area scale manufacturing. By using other inexpensive material components, e.g., replacing gold with carbon for electrodes and replacing expensive organic compounds with carbon films for hole transporting layers, at least some embodiments of the disclosed solar cells are significantly less expensive.

In one aspect, a solar cell comprises a first electrode; a counter electrode; an electron transporting layer of metal oxide disposed between the first electrode and the counter electrode; and a light sensitizing layer of perovskite disposed on the surface of the electron transporting layer between the first electrode and the counter electrode. The perovskite may have a formula selected from the group consisting of $A_2MX_6$, $Z_2MX_6$ or $YMX_6$, wherein A is an alkali metal, M is a metal or a metalloid; X is a halide; Z is selected from the group consisting of a primary ammonium, an iminium, a secondary ammonium, a tertiary ammonium, and a quaternary ammonium; and Y has formula $M_b(L)_3$, wherein $M_b$ is a transition metal in the 2+ oxidation state L is an N—N neutral chelating ligand.

In another aspect, a method of making a perovskite sensitizing layer comprises depositing (e.g., via electrospraying) a solution comprising a perovskite on the surface of a substrate (e.g., an electron transporting layer), and, optionally, subsequently annealing the perovskite sensitizing layer at an annealing temperature for an annealing time. The perovskites may have a formula selected from the group consisting of $A_2MX_6$, $Z_2MX_6$ or $YMX_6$, wherein A is an alkali metal; M is a metal or a metalloid; X is a halide; Z is selected from the group consisting of a primary ammonium, an iminium, a secondary ammonium, a tertiary ammonium, and a quaternary ammonium; and Y has formula $M_b(L)_3$, wherein $M_b$ is a transition metal in the 2+ oxidation state L is an N—N neutral chelating ligand.

In another aspect, a method of making a perovskite sensitizing layer comprises exposing (e.g., via electrospraying) a substrate (e.g., an electron transporting layer of metal oxide) to a first solution comprising a first perovskite precursor to form a first coating on the surface of the substrate and, optionally, subsequently annealing the coated substrate at a first annealing temperature for a first annealing time; and exposing (e.g., via electrospraying or drop casting) the coated substrate to a second solution comprising a second perovskite precursor to form a second coating over the surface of the substrate and, optionally, subsequently annealing the coated substrate at a second annealing temperature for a second annealing time to form the perovskite sensitizing layer on the surface of the substrate.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

FIG. 2A shows the JV characteristic. FIG. 2B shows incident photon to current efficiency (IPCE) as a function of wavelength.

FIG. 3A is a schematic diagram of the solar cell. FIG. 3B is a SEM image of a cross-section of the solar cell. FIG. 3C is a band diagram of the solar cell.

FIG. 4A shows the JV characteristic. FIG. 4B shows incident photon to current efficiency (IPCE) as a function of wavelength.

FIG. 5A is a schematic diagram of the solar cell. FIG. 5B shows a SEM image of a cross-section of the device.

FIG. 14A illustrates a spin coating method. FIG. 14B illustrates a drop casting method. FIG. 14C illustrates an electrospray method.

FIGS. 15A-F show SEM images of electron transporting layers treated with a first perovskite precursor as a function of annealing temperature. FIG. 15A is an image of the electron transporting layer at room temperature. FIG. 15B is an image of the electron transporting layer at 100° C. FIG. 15C is an image of the electron transporting layer at 200° C. FIG. 15D is an image of the electron transporting layer at 300° C. FIG. 15E is an image of the electron transporting layer at 400° C. FIG. 15F is an image of the electron transporting layer at 500° C.

FIG. 17A shows a SEM image of the perovskite light sensitizing layer formed over the treated electron transporting layer of FIG. 15A. FIG. 17B shows a SEM image of the perovskite light sensitizing layer formed over the treated electron transporting layer of FIG. 15B. FIG. 17C shows a SEM image of the perovskite light sensitizing layer formed over the treated electron transporting layer of FIG. 15C. FIG. 17D shows a SEM image of the perovskite light sensitizing layer formed over the treated electron transporting layer of FIG. 15D. FIG. 17E shows a SEM image of the perovskite light sensitizing layer formed over the treated electron transporting layer of FIG. 15E. FIG. 17F shows a SEM image of the perovskite light sensitizing layer formed over the treated electron transporting layer of FIG. 15F.

FIG. 22A shows the JV characteristic of solar cells comprising $Cs_2SnBr_xI_{6-x}$ perovskite light sensitizing layers. FIG. 22B shows incident photon to current efficiency (IPCE) as a function of wavelength for $Cs_2SnI_6$ perovskite light sensitizing layers with/without Sn doping of $TiO_2$.

DETAILED DESCRIPTION

Figure 1:
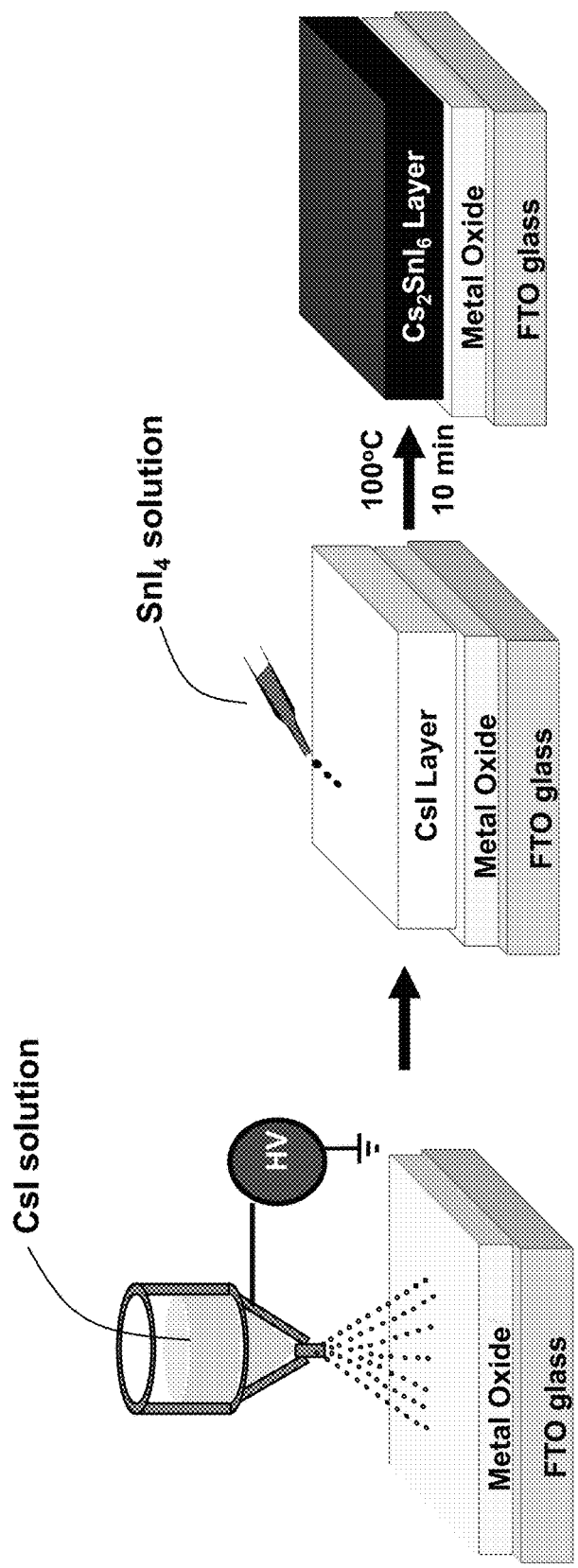
FIG. 1 illustrates a method of making a solar cell comprising a light sensitizing layer of perovskite having the formula $A_2MX_6$ (e.g., $Cs_2SnI_6$) according to an illustrative embodiment.

Provided are solar cells comprising perovskite light sensitizing layers and methods of making the solar cells.

The devices and methods will be described more fully hereinafter with reference to the accompanying drawings in which some, but not all, permutations and variations of the embodiments of the invention are shown. Indeed, the invention may be embodied in many different forms and should not be construed as limited to the embodiments set forth herein. These embodiments are provided in sufficient written detail to describe and enable one of ordinary skill in the art to make and utilize the invention as defined by the claims and equivalents thereof.

Likewise, many modifications and other embodiments of the devices and methods disclosed herein will come to mind to one of skill in the art to which the inventions pertain having benefit of the teachings presented in the foregoing descriptions and associated drawings. Therefore, it is to be understood that the inventions disclosed herein are not to be limited to the specific embodiments disclosed and that modifications and other embodiments are intended to be included within the scope of the appended claims. Although specific terms are disclosed herein, they are used in a generic and descriptive sense only and not for purposes of limitation.

Definitions and Terminology

Unless defined otherwise, all technical and scientific terms used herein have the same meaning as commonly understood by one of skill in the art to which the invention pertains. Although any methods and materials similar to or equivalent to those described herein can be used in the practice or testing of the present invention, the preferred methods and materials are described herein.

Certain terms are first defined. Additional terms are defined throughout the specification.

Terms used herein are intended as "open" terms (for example, the term "including" should be interpreted as "including but not limited to," the term "having" should be interpreted as "having at least," the term "includes" should be interpreted as "includes but is not limited to," etc.).

Furthermore, in those instances where a convention analogous to "at least one of A, B and C, etc." is used, in general such a construction is intended in the sense of one having ordinary skill in the art would understand the convention (for example, "a system having at least one of A, B and C" would include but not be limited to systems that have A alone, B alone, C alone, A and B together, A and C together, B and C together, and/or A, B, and C together).

All language such as "from," "to," "up to," "at least," "greater than," "less than," and the like, include the number recited and refer to ranges which can subsequently be broken down into sub-ranges as discussed above.

A range includes each individual member. Thus, for example, a group having 1-3 members refers to groups having 1, 2, or 3 members. Similarly, a group having 6 members refers to groups having 1, 2, 3, 4, or 6 members, and so forth.

The modal verb "may" refers to the preferred use or selection of one or more options or choices among the several described embodiments or features contained within the same. Where no options or choices are disclosed regarding a particular embodiment or feature contained in the same, the modal verb "may" refers to an affirmative act regarding how to make or use and aspect of a described embodiment or feature contained in the same, or a definitive decision to use a specific skill regarding a described embodiment or feature contained in the same. In this latter context, the modal verb "may" has the same meaning and connotation as the auxiliary verb "can."

As used herein, the articles "a" and "an" refer to one or to more than one (for example, to at least one) of the grammatical object of the article.

"About" and "approximately" shall generally mean an acceptable degree of error for the quantity measured given the nature or precision of the measurements. Exemplary degrees of error are within 20-25 percent (%), typically, within 10%, and more typically, within 5% of a given value or range of values.

Use of directional terms, e.g., top, bottom, right, left, up, down, etc. are merely intended to facilitate reference to the various surfaces in the disclosed solar cells and are not intended to be limiting in any manner.

The "light sensitization layer" or "light sensitizing layer" as used herein is a section of a solar cell that captures and generates photoelectrons. Thus these terms have the same functional equivalency as the dye-sensitized layer in a dye-sensitized solar cell (DSSC). Furthermore, this term synonymous with the term "solar absorbing layer" and "absorber."

The term "perovskite" as used herein includes inorganic compounds, organic compounds and metal-organic compounds. Thus, the term perovskite is meant to include the traditional inorganic compounds with the general formula $AMX_3$ in addition to $A_2MX_6$, $Z_2MX_6$ and $YMX_6$ materials disclosed herein. The $A_2MX_6$ inorganic compounds disclosed herein, in addition to the $Z_2MX_6$ inorganic-organic compounds disclosed herein and the $YMX_6$ metal-organic compounds disclosed herein, denote a special case of the perovskite class where ½ of the M sites are empty. In any of the formulas $AMX_3$, $A_2MX_6$, $Z_2MX_6$ and $YMX_6$, more than one type of X element may be present in the compound (e.g., $X_1$ and $X_2$) in varying relative amounts, provided the sum of the amounts is 6. For example, compounds having formula $A_2M(X_1)_x(X_2)_{6-x}$, wherein x ranges from 0 to 6, are encompassed by the formula $A_2MX_6$.

Solar Cells

In one aspect, a solar cell comprising an electron transporting layer and a light sensitizing layer of perovskite disposed over the electron transporting layer is provided. Photovoltaic cells incorporating the perovskite compounds as a light sensitizing material can take on a variety of forms. Generally, however, the cells will comprises a first electrode comprising an electrically conductive material; a second electrode comprising an electrically conductive material; the light sensitizing layer disposed between (including partially between) and in electrical communication with the first and second electrodes; and an electron transporting material disposed between (including partially between) the first and second electrodes and configured to facilitate the transport of electrons (that is, to provide preferential transport of electrons relative to holes) generated in the light sensitizing layer to one of the first or second electrodes. The cells may also comprise a hole transporting material disposed between (including partially between) the first and second electrodes and configured to facilitate the transport of holes (that is, to provide preferential transport of holes relative to electrons) generated in the light sensitizing layer to the other of the first or second electrode.

At least one of the two electrodes is desirably transparent to the incident radiation (e.g., solar radiation). The transparent nature of the electrode can be accomplished by constructing the electrode from a transparent material or by using an electrode that does not completely cover the incident surface of the cell (e.g., a patterned electrode). One example of a transparent electrode comprises a transparent conducting oxide (e.g., fluorine-doped tin oxide (FTO)) coating on a transparent substrate. Other examples of suitable electrode materials include indium tin oxide, graphite and graphene. Large-effective surface area polyaromatic hydrocarbon (LPAH)-based electrodes can also be used. Such electrodes are described in Lee et al., Energy and Environmental Science, 2012, 5(5), 6941-6952.

Figure 11:
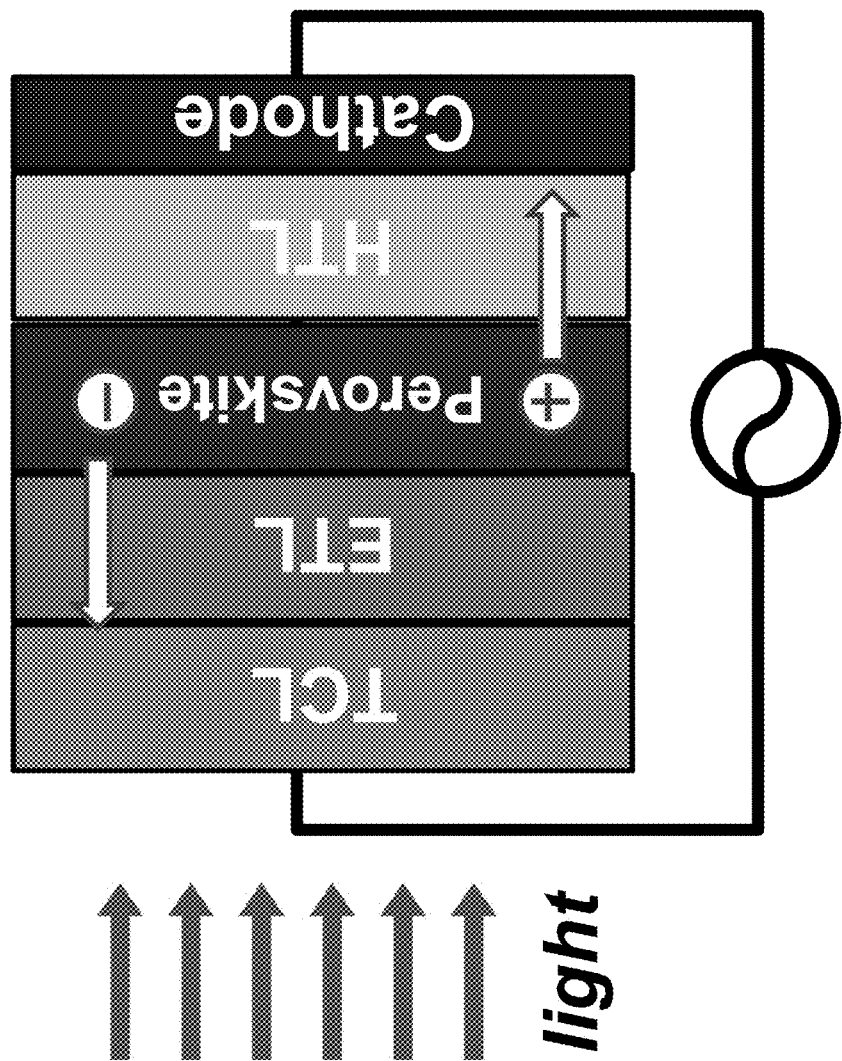
FIG. 11 shows a schematic of a solar cell comprising a light sensitizing layer of perovskite (e.g., $Cs_2SnI_6$) according to an illustrative embodiment.

A schematic of a solar cell according to an illustrative embodiment is shown in FIG. 11. The basic operation of the solar cell is also illustrated in FIG. 11. Light travels into the cell through a transparent conducting layer (TCL) from the left. This layer also serves to transport electrons from the electron transporting layer (ETL) to the external circuit. The main function of the light sensitizing layer (e.g., $Cs_2SnI_6$, a $A_2MX_6$ perovskite) is to absorb the light and convert it into charge pairs with the electrons transporting through the ETL and the holes transporting through the hole transporting layer (HTL) and then through the anode and cathode electrodes, respectively, to the external circuit.

Figure 12:
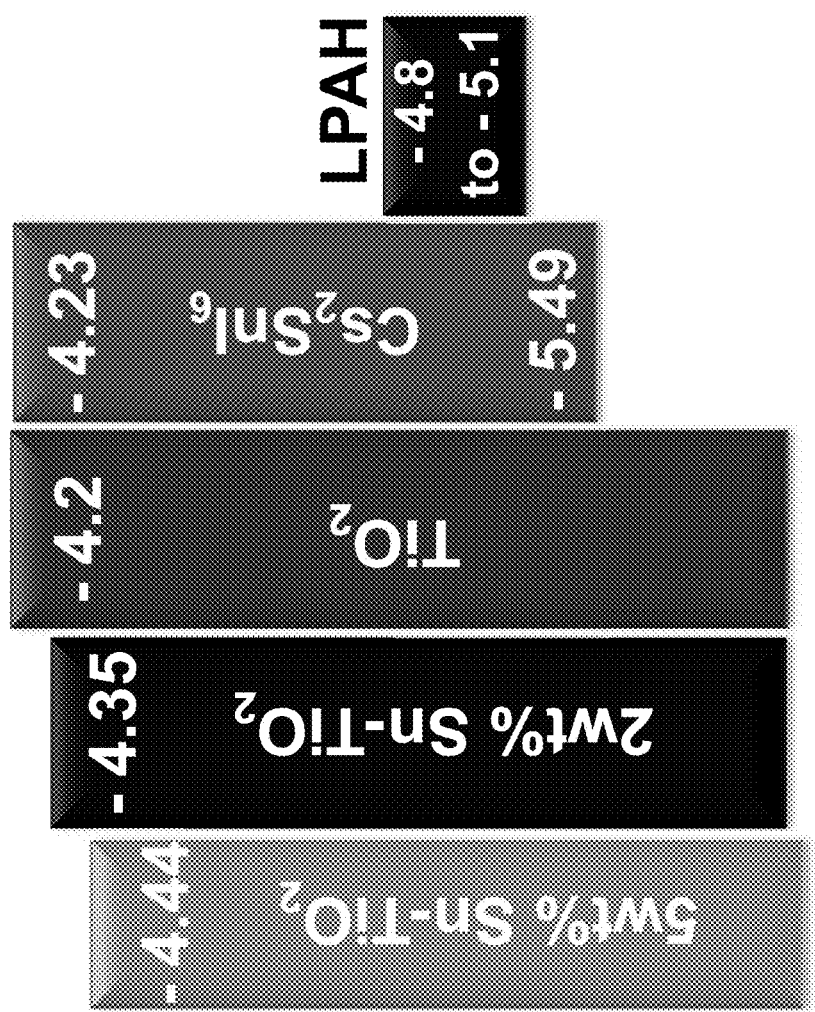
FIG. 12 shows the energy level diagram of selected layers of a solar cell comprising a light sensitizing layer of perovskite (e.g., $Cs_2SnI_6$) according to an illustrative embodiment.

Although the disclosed solar cells may be formed from a variety of materials and may assume a variety of geometries, the materials and geometries may be selected to achieve one or more of the advantages described above. In addition, the band alignment of the layers of the disclosed solar cells is desirably such that the charges generated in the light sensitizing layer do not have to overcome potential barriers as they travel across the layers to the external circuit. Thus, the particular composition of the layers of the disclosed solar cells may be selected to minimize such potential barriers. By way of illustration, a suitable band alignment is shown in FIG. 12 for an electron transporting layer composed of either 5 wt % $Sn-TiO_2$, 2 wt % $Sn-TiO_2$, or $TiO_2$; a light sensitizing layer composed of $Cs_2SnI_6$; and a hole transporting layer composed of LPAH.

The overall performance of the disclosed solar cells is also governed by the charge recombination losses in the layer materials as well as at the interfaces between the layers. Thus, the particular geometry of the solar cell may be selected to minimize these losses to reach optimal device efficiencies. Key parameters involved in the design are the absorption length and recombination (diffusion) length with everything else being equal. These parameters are desirably considered in the selected geometry of the solar cell.

Figure 19:
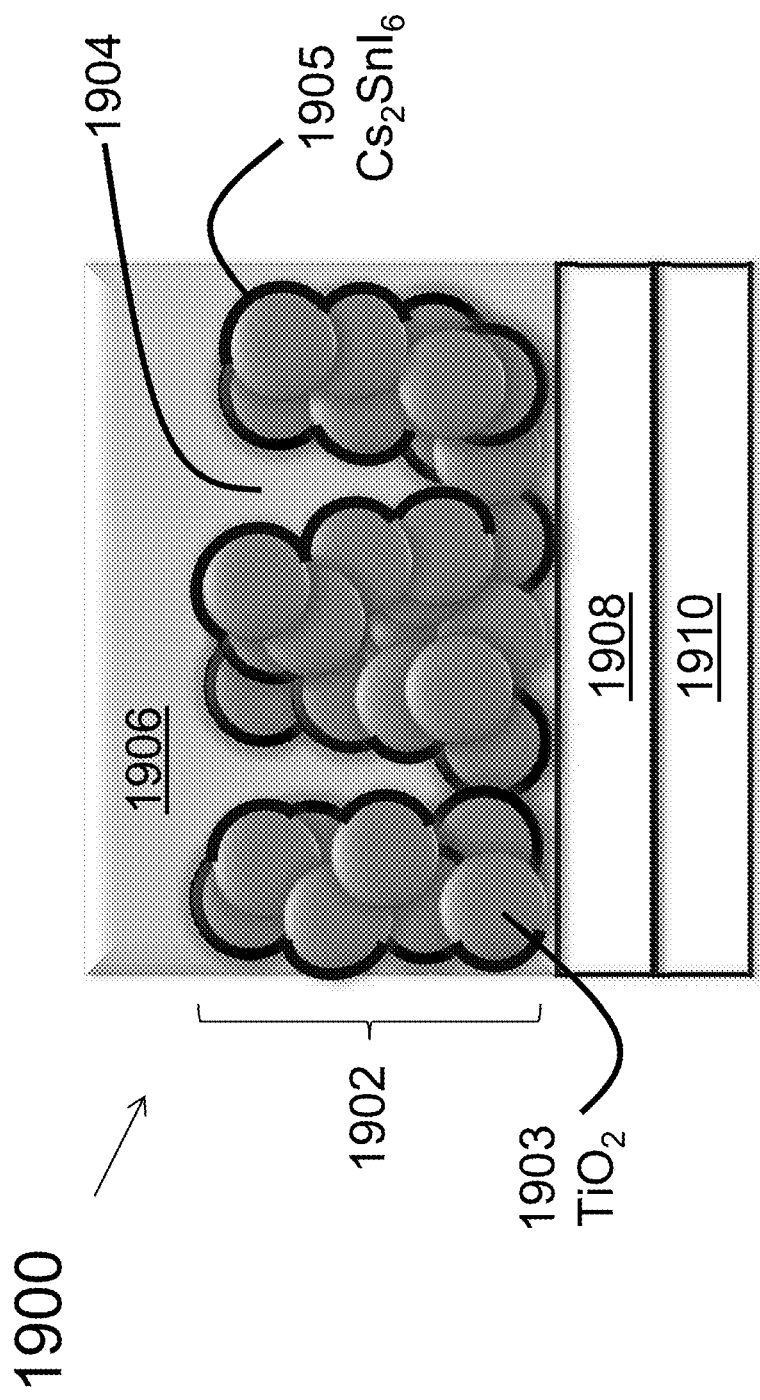
FIG. 19 illustrates a schematic of a solar cell having a Type I configuration according to an illustrative embodiment.

By way of illustration, four suitable geometry types are illustrated in FIGS. 19-22. FIG. 19 is a schematic of a solar cell 1900 having a Type I configuration. The Type I configuration adopts a geometry similar to a dye-sensitized solar cell (DSSC). The solar cell 1900 comprises a mesoporous electron transporting layer 1902 comprising nanostructures 1903 (e.g., $TiO_2$ nanospheres) defining pores 1904. The solar cell 1900 further comprises a light sensitizing layer of perovskite 1905 (e.g., $Cs_2SnI_6$) disposed on the surface of the mesoporous electron transporting layer 1902. The light sensitizing layer of perovskite 1905 forms a coating on the surface of the nanostructures 1903 which is sufficiently thin such that the light sensitizing layer of perovskite 1905 does not substantially fill the pores 1904 of the mesoporous electron transporting layer 1902. The solar cell 1900 further comprises a hole transporting layer 1906 disposed on the light sensitizing layer of perovskite 1905 which is sufficiently fluid (i.e., has a sufficiently low viscosity) so as to penetrate into the pores 1904 of the mesoporous electron transporting layer 1902 to substantially fill the pores 1904. The solar cell 1900 also comprises a blocking layer 1908 (e.g., composed of dense $TiO_2$). By "dense" it is meant that the material is substantially non-porous. Each of the layers is disposed over a transparent conducting layer 1910. In the Type I configuration, the light and the charge transport directions are the same. Thus, in this case, the optimization of the geometry is determined by the balancing of the absorption and recombination length scales described above. In the Type I configuration, certain interfaces formed between layers of the solar cell (e.g., the interface formed between the mesoporous electron transporting layer 1902 and the light sensitizing layer of perovskite 1905 and the interface formed between the light sensitizing layer of perovskite 1905 and the hole transporting layer 1906) are substantially rough. As further described below, this is by contrast to solar cells having a Type II configuration in which the interfaces are substantially flat and planar.

Figure 20:
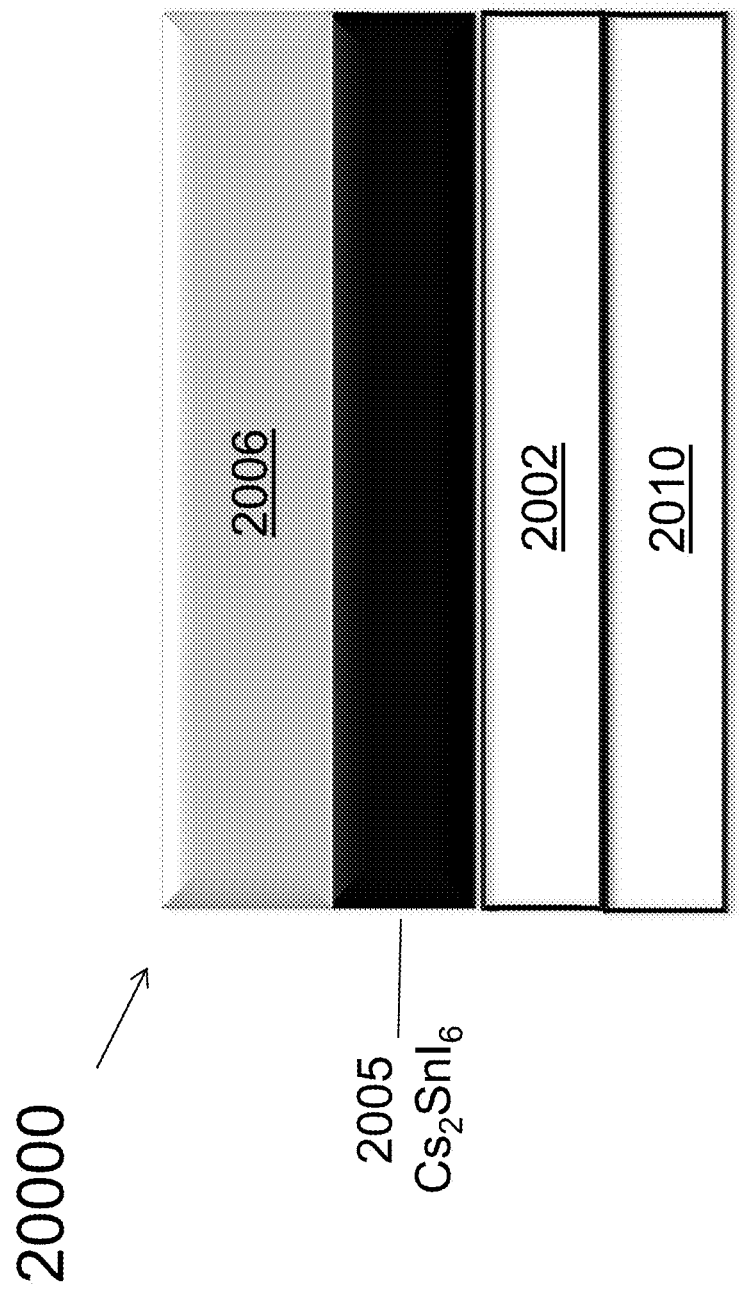
FIG. 20 illustrates a schematic of a solar cell having a Type II configuration according to an illustrative embodiment.

FIG. 20 is a schematic of a solar cell 2000 having a Type II configuration. The Type II configuration adopts a planar geometry in which the interfaces formed between layers of the solar cell are substantially flat and planar. The solar cell 2000 comprises an electron transporting layer 2002 (e.g., composed of dense $TiO_2$). The solar cell 2000 further comprises a light sensitizing layer of perovskite 2005 (e.g., $Cs_2SnI_6$) disposed on the surface of the electron transporting layer 2002. The solar cell 2000 further comprises a hole transporting layer 2006 (e.g., composed of LPAH). Each of the layers is disposed over a transparent conducting layer 2010. The Type II configuration allows for the growth of very high quality crystalline perovskite films, which can serve to improve the performance of the solar cell.

Figure 21:
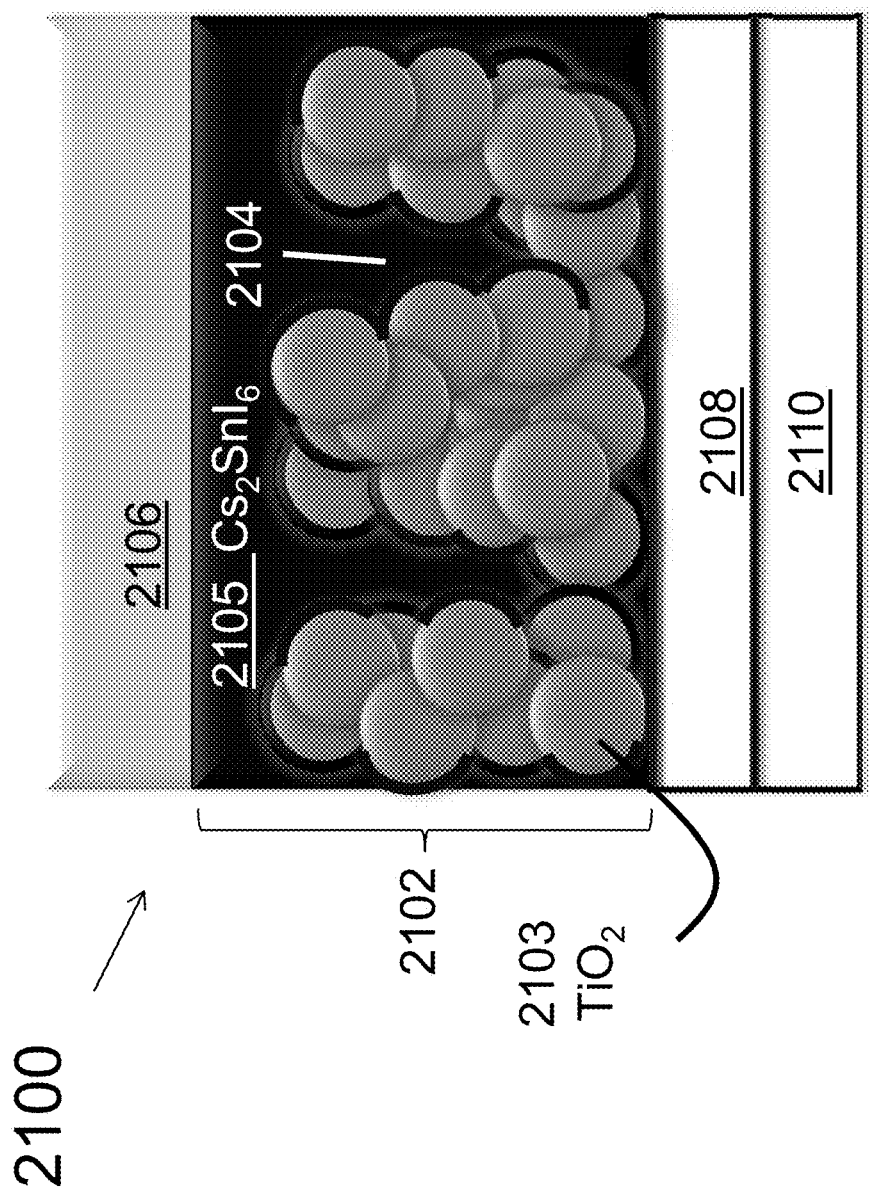
FIG. 21 illustrates a schematic of a solar cell having a Type III configuration according to an illustrative embodiment.

FIG. 21 is a schematic of a solar cell 2100 having a Type III configuration. The Type III configuration adopts a geometry which is a hybrid of the Type I and Type II configurations. The solar cell 2100 comprises a mesoporous electron transporting layer 2102 comprising nanostructures 2103 (e.g., $TiO_2$ nanospheres) defining pores 2104. The solar cell 2100 further comprises a light sensitizing layer of perovskite 2105 (e.g., $Cs_2SnI_6$) disposed on the surface of the mesoporous electron transporting layer 2102. The light sensitizing layer of perovskite 2105 forms a coating on the surface of the nanostructures 2103 which is sufficiently fluid (e.g., has sufficiently low viscosity) such that the light sensitizing layer of perovskite 2105 penetrates into the pores 2104 of the mesoporous electron transporting layer 2102 to substantially fill the pores 2104. The solar cell 2100 further comprises a hole transporting layer 2106 disposed on the light sensitizing layer of perovskite 2105. The solar cell 2100 also comprises a blocking layer 2108 (e.g., composed of dense $TiO_2$). Each of the layers is disposed over a transparent conducting layer 2110. The Type III configuration takes the advantage of the large effective surface area of the light sensitizing layer of perovskite 2105 to increase light absorption. To minimize recombination losses, the light sensitizing layer of perovskite 2105 is desirably of high crystalline quality to improve its electrical properties. Similar to the Type I configuration, in the Type III configuration, certain interfaces formed between layers of the solar cell (e.g., the interface formed between the mesoporous electron transporting layer 2102 and the light sensitizing layer of perovskite 2105) are substantially rough. However, similar to the Type II configuration, in the Type III configuration, other interfaces (e.g., the interface formed between the light sensitizing layer of perovskite 2105 and the hole transporting layer 2106) are substantially flat and planar.

Perovskites

The perovskite from which the light sensitizing layer is composed is a perovskite compound which is capable of absorbing light (e.g., sunlight or light having a wavelength within the absorption region of the material) to generate photoelectrons. In some embodiments, the light sensitizing layer (and the perovskite) is free of lead (Pb). In some embodiments, the light sensitizing layer (and the perovskite) is all inorganic, i.e., free of organic groups and organic compounds.

In some embodiments, the perovskite has Formula I, $$A_2MX_6 \quad \text{(Formula I).}$$

In Formula I, A is an alkali metal, M is a metal or a metalloid, and X is a halide. A may be selected from the group consisting of Cs, Rb, K, Na and Li. The metal may be a Group 4 metal or a Group 10 metal. The metalloid may be a Group 14 metalloid or a Group 16 metalloid. M may be selected from the group consisting of Sn, Ge, Te, Ti, Zr, Hf, Ni, Pd and Pt. X may be selected from the group consisting of F, Cl, Br, I and At or a mixture thereof. For example X may represent two or more different halides, such as a combination of I and Br atoms.

The disclosed $A_2MX_6$ perovskites may also be referred to as molecular halide salt compounds, rather than perovskites. The disclosed $A_2MX_6$ perovskites have a high-symmetry cubic structure, are soluble, and exhibit good air and moisture stability. Their stability means that the solar cell may be fabricated in ambient atmosphere without regards to degradation, thereby simplifying manufacturing and resulting in cost savings. The disclosed $A_2MX_6$ perovskites are all inorganic, i.e., free of organic groups and organic compounds and free of lead. Thus, the solar cells are environmentally safe, make use of less expensive materials and are more stable to UV radiation damage.

Figure 10:
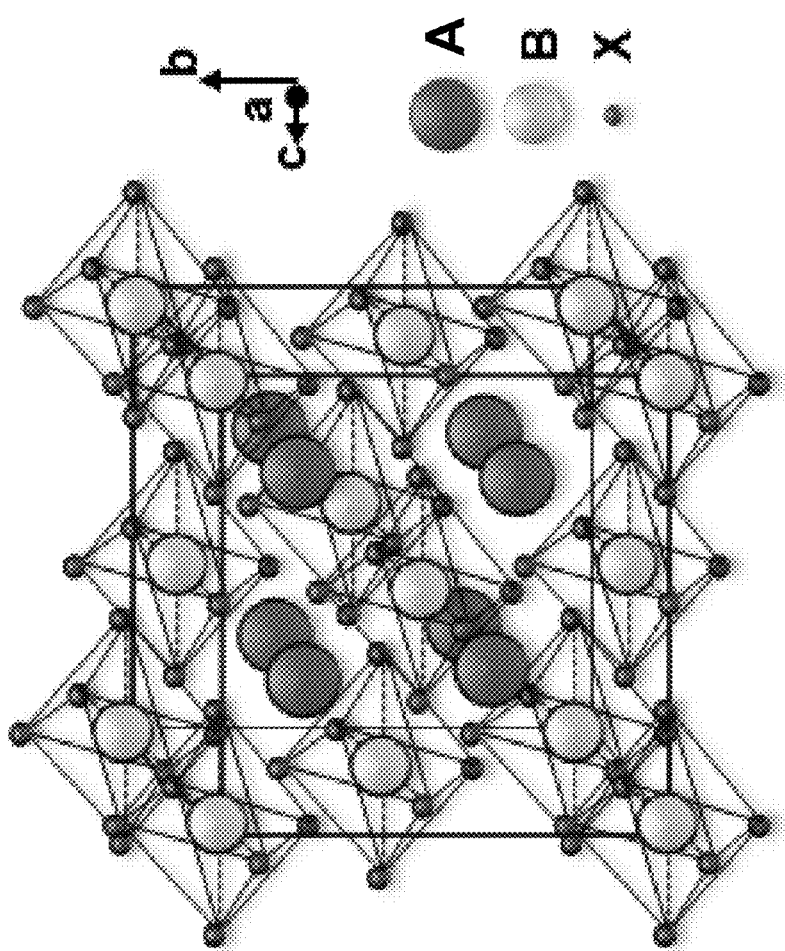
FIG. 10 illustrates the three-dimensional structure of $A_2MX_6$.

The three-dimensional structure of $A_2MX_6$ is shown in FIG. 10.

In some embodiments, the perovskite has Formula II, $$Z_2MX_6 \quad \text{(Formula II)}.$$

In Formula II, Z is selected from the group consisting of a primary ammonium, an iminium, a secondary ammonium, a tertiary ammonium, and a quaternary ammonium. The primary ammonium may have the formula $RNH_3$ wherein R is H, an alkyl group or an aryl group. The iminium may have the formula $RC(NH_2)_2$, wherein R is H, an alkyl group or an aryl group. A suitable iminium is $HC(NH_2)_2$. Alternatively, the iminium may have the formula $C(NH_2)_3$. The secondary ammonium may have the formula $R_2NH_2$ wherein R is an alkyl group or an aryl group. The tertiary ammonium may have the formula $R_3NH$ wherein R is an alkyl group or an aryl group. Alternatively, the tertiary ammonium may have the formula $RC_5H_5NR'$, wherein R is H, an aryl group or an alkyl group, R' is H, an alkyl group or an aryl group, and wherein $C_5H_5N$ is a pyridine ring. The quaternary ammonium may have the formula $R_4N$, wherein R is an alkyl group or an aryl group.

In Formula II, M is a metal or a metalloid and X is a halide as described above with respect to Formula I. Suitable metals, metalloids and halides have been described above with respect to Formula I.

In some embodiments, the perovskite has Formula III, $$YMX_6 \quad \text{(Formula III)}.$$

In Formula III, Y is $M_b(L)_3$, wherein $M_b$ is a transition metal in the 2+ oxidation state, and wherein L is an N—N neutral chelating ligand. Ru is a suitable transition metal. A bipyridine is a suitable N—N neutral chelating ligand. In Formula III, M is a metal or a metalloid and X is a halide as described above with respect to Formula I. Suitable metals, metalloids and halides have been described above with respect to Formula I.

In the Formulas above, the following definitions may be used. An alkyl group may be a linear, branched or cyclic alkyl group in which the number of carbons may range from, e.g., 2 to 24, 2 to 12, 2 to 6, 1 to 3, etc. The alkyl group may be unsubstituted, by which it is meant the alkyl group contains no heteroatoms. The alkyl group may be substituted, by which it is meant an unsubstituted alkyl group in which one or more bonds to a carbon(s) or hydrogen(s) are replaced by a bond to non-hydrogen and non-carbon atoms. Non-hydrogen and non-carbon atoms include, e.g., a halogen atom such as F, Cl, Br, and I; an oxygen atom, including an oxygen atom in groups such as hydroxyl, alkoxy, aryloxy, carbonyl, carboxyl, and ester groups; a nitrogen atom, including a nitrogen atom in groups such as amines, amides, alkylamines, arylamines, and alkylarylamines, and nitriles; and a sulfur atom. Methyl is a suitable alkyl group.

An aryl group may be monocyclic having one aromatic ring or polycyclic having fused aromatic rings (e.g., two, three, etc. rings). Monocyclic and polycyclic aryl groups may be unsubstituted or substituted. Substituted monocyclic and polycyclic aryl groups are groups in which one or more bonds to a carbon(s) or hydrogen(s) are replaced by a bond to non-hydrogen and non-carbon atoms. Illustrative non-hydrogen and non-carbon atoms have been described above.

In some embodiments, the perovskite is not a perovskite having formula $AMX_3$.

Tables 1-4, below, list suitable perovskites capable for use as the light sensitizing layer in the disclosed solar cells.

TABLE 1

Group 14 Metalloid (e.g., Sn) Perovskites

| Alkali Metal Salts |
|---|
| $Cs_2SnI_6$ |
| $Rb_2SnI_6$ |
| $K_2SnI_6$ |
| $Na_2SnI_6$ |
| $Li_2SnI_6$ |
| Primary Ammonium Salts |

| $(RNH_3)_2SnI_6$ (R = H, alkyl group) |
| $(RNH_3)_2SnI_6$ (R = aryl group) |
| Iminium Salts |

| $(RC(NH_2)_2)_2SnI_6$ (R = H, alkyl group) |
| $(RC(NH_2)_2)_2SnI_6$ (R = aryl group) |
| $(C(NH_2)_3)_2SnI_6$ |
| Secondary Ammonium Salts |

| $(R_2NH_2)_2SnI_6$ (R = alkyl group) |
| $(R_2NH_2)_2SnI_6$ (R = aryl group) |
| Tertiary Ammonium Salts |

| $(R_3NH)_2SnI_6$ (R = alkyl group) |
| $(R_3NH)_2SnI_6$ (R = aryl group) |
| $(RC_5H_5NR')_2SnI_6$ (R,R' = H, alkyl group, $C_5H_5N$ denotes the pyridine ring) |
| $(RC_5H_5NR')_2SnI_6$ (R,R' = H, aryl group, $C_5H_5N$ denotes the pyridine ring) |
| Quaternary Ammonium Salts |

| $(R_4N)_2SnI_6$ (R = alkyl group) |
| $(R_4N)_2SnI_6$ (R = aryl group) |
| Complex Cations |

| $[M(L)_3]SnI_6$ (M = a transition metal in the 2+ oxidation state, L = a N-N neutral chelating ligand) |

TABLE 2

Group 16 Metalloid (e.g., Te) Perovskites.

| Alkali Metal Salts |
|---|
| $Cs_2TeI_6$ |
| $Rb_2TeI_6$ |
| $K_2TeI_6$ |
| $Na_2TeI_6$ |
| $Li_2TeI_6$ |
| Primary Ammonium Salts |

| $(RNH_3)_2TeI_6$ (R = H, alkyl group) |
| $(RNH_3)_2TeI_6$ (R = aryl group) |
| Iminium Salts |

| $(RC(NH_2)_2)_2TeI_6$ (R = H, alkyl group) |
| $(RC(NH_2)_2)_2TeI_6$ (R = aryl group) |
| $(C(NH_2)_3)_2TeI_6$ |
| Secondary Ammonium Salts |

| $(R_2NH_2)_2TeI_6$ (R = alkyl group) |
| $(R_2NH_2)_2TeI_6$ (R = aryl group) |
| Tertiary Ammonium Salts |

| $(R_3NH)_2TeI_6$ (R = alkyl group) |
| $(R_3NH)_2TeI_6$ (R = aryl group) |
| $(RC_5H_5NR')_2TeI_6$ (R,R' = H, alkyl group, $C_5H_5N$ denotes the pyridine ring) |
| $(RC_5H_5NR')_2TeI_6$ (R,R' = H, aryl group, $C_5H_5N$ denotes the pyridine ring) |
| Quaternary Ammonium Salts |

| $(R_4N)_2TeI_6$ (R = alkyl group) |
| $(R_4N)_2TeI_6$ (R = aryl group) |

TABLE 2-continued

Group 16 Metalloid (e.g., Te) Perovskites.

Complex Cations $[M(L)_3]TeI_6$ (M = a transition metal in the 2+ oxidation state, L = a N-N neutral chelating ligand)

TABLE 3

Group 4 Metal (e.g., Ti, Zr, Hf) Perovskites.

Alkali Metal Salts $Cs_2MI_6$
$Rb_2MI_6$
$K_2MI_6$
$Na_2MI_6$
$Li_2MI_6$

Primary Ammonium Salts $(RNH_3)_2MI_6$ (R = H, alkyl group)
$(RNH_3)_2MI_6$ (R = aryl group)

Iminium Salts $(RC(NH_2)_2)_2MI_6$ (R = H, alkyl group)
$(RC(NH_2)_2)_2MI_6$ (R = aryl group)
$(C(NH_2)_3)_2MI_6$

Secondary Ammonium Salts $(R_2NH_2)_2MI_6$ (R = alkyl group)
$(R_2NH_2)_2MI_6$ (R = aryl group)

Tertiary Ammonium Salts $(R_3NH)_2MI_6$ (R = alkyl group)
$(R_3NH)_2MI_6$ (R = aryl group)
$(RC_5H_5NR')_2MI_6$ (R,R'= H, alkyl group, $C_5H_5N$ denotes the pyridine ring)
$(RC_5H_5NR')_2MI_6$ (R,R'= H, aryl group, $C_5H_5N$ denotes the pyridine ring)

Quaternary Ammonium Salts $(R_4N)_2MI_6$ (R = alkyl group)
$(R_4N)_2MI_6$ (R = aryl group)

Complex Cations $[M(L_3)]MI_6$ (M = a transition metal in the 2+ oxidation state, L = a N-N neutral chelating ligand)

TABLE 4

Group 10 Metal (e.g., Ni, Pd, Pt) Perovskites.

Alkali Metal Salts $Cs_2MI_6$
$Rb_2MI_6$
$K_2MI_6$
$Na_2MI_6$
$Li_2MI_6$

Primary Ammonium Salts $(RNH_3)_2MI_6$ (R = H, alkyl group)
$(RNH_3)_2MI_6$ (R = aryl group)

Iminium Salts $(RC(NH_2)_2)_2MI_6$ (R = H, alkyl group)
$(RC(NH_2)_2)_2MI_6$ (R = aryl group)
$(C(NH_2)_3)_2MI_6$

Secondary Ammonium Salts $(R_2NH_2)_2MI_6$ (R = alkyl group)
$(R_2NH_2)_2MI_6$ (R = aryl group)

TABLE 4-continued

Group 10 Metal (e.g., Ni, Pd, Pt) Perovskites.

Tertiary Ammonium Salts $(R_3NH)_2MI_6$ (R = alkyl group)
$(R_3NH)_2MI_6$ (R = aryl group)
$(RC_5H_5NR')_2MI_6$ (R,R'= H, alkyl group, $C_5H_5N$ denotes the pyridine ring)
$(RC_5H_5NR')_2MI_6$ (R,R'= H, aryl group, $C_5H_5N$ denotes the pyridine ring)

Quaternary Ammonium Salts $(R_4N)_2MI_6$ (R = alkyl group)
$(R_4N)_2MI_6$ (R = aryl group)

Complex Cations $[M(L)_3]MI_6$ (M = a transition metal in the 2+ oxidation state, L = a N-N neutral chelating ligand)

Electron Transporting Layer

The disclosed solar cells comprise an electron transporting layer. Various materials may be used for the electron transporting layer, provided the material is capable of transporting electrons generated by the perovskite light sensitizing layer. Metal oxide is a suitable material. Illustrative metal oxides include $TiO_2$, ZnO, and $SnO_2$. The metal oxide may be doped (e.g., using Sn) or undoped. The amount of dopant may be adjusted to optimize the band alignment for the layers of the solar cell.

The electron transporting layer may be characterized by its morphology. The electron transporting layer may comprise (or be composed of) nanostructures. The shape of the nanostructures is not particularly limited. The nanostructures may be spherical in shape (i.e., nanospheres) or less regular in shape (i.e., nanoparticles) or may include combinations thereof. The nanostructures may be characterized by their diameter or their aspect ratio. The average diameter of the nanostructures may be less than about 50 nm (e.g., about 10 nm or about 25 nm). The nanostructures may be characterized by their surface area. The average surface area of the nanostructures may be no more than about 85 $m^2/g$ (e.g., for nanoparticles) or about 85 $m^2/g$ or greater (e.g., for nanospheres).

Nanostructured electron transporting layers may be porous (e.g., mesoporous) comprising a plurality of pores which are defined by the surfaces of the nanostructures. The pores may be characterized by their diameter. The average pore diameter may be in the range of from about 2 nm to about 500 nm. This includes embodiments in which the average pore diameter is in the range of from about 2 nm to about 25 nm. Porous electron transporting layers may be characterized by their cumulative pore volume. The cumulative pore volume may be in the range of from about 0.4 $cm^3/g$ to about 0.9 $cm^3/g$.

Conductive Substrates

The layers of the disclosed solar cell may be formed over a variety of conductive substrates (e.g., bottom conductive substrates), e.g., fluorine-doped tin oxide (FTO), indium tin oxide (ITO) or nanometal-glass composites.

Other Material Layers

The solar cell may comprise a variety of other material layers. Illustrative layers include contact layers, blocking layers, hole transporting layers composed of a material capable of transporting holes generated by the perovskite light sensitizing layer, other conductive substrates (e.g., top conductive substrates). The materials used for the other layers in the solar cell may be selected from a broad range of materials, provided that the selected material is capable of carrying out the designated function of the layer. The hole transporting layer may be a solid state hole transporting layer comprising a compound of the formula $AMX_3$ or $A_2MX_6$, such as $CsSnI_3$ or $CsSnI_6$. Hole transporting layers of this type are described in U.S. patent application publication number 2013/0233377. Another suitable material for the hole transporting layer is large-effective-surface-area polyaromatic hydrocarbon (LPAH). A suitable material for the top conductive substrate (electrode) includes a metal (e.g., Au or Pt) or graphite. Contact layers may be used to smooth out the interface between other layers of the disclosed solar cells.

The thicknesses of the various layers in the solar cell may be selected from a broad range, provided that the selected thickness renders the layer capable of carrying out its designated function. The thickness may be an average value across the entire layer. The thickness of the perovskite light sensitizing layer may be large enough to provide a significant absorber volume, but thin enough to limit the effects of carrier recombination. In some embodiments, the average thickness of the perovskite light sensitizing layer is in the range of from about 1 nm to about 10 µm, or from about 400 nm to about 10 µm. This includes embodiments in which the average thickness of the perovskite light sensitizing layer is in the range of from about 1 nm to about 5 µm, from about 1 nm to about 2 µm, from about 400 nm to about 5 µm, or from about 400 nm to about 2 µm. In some embodiments, the average thickness of the electron transporting layer is in the range of from about 1 nm to about 5 µm, or from about 500 nm to about 5 µm. In some embodiments, the average thickness of the hole transporting layer is in the range of from about 1 nm to about 2 µm, or from about 500 nm to about 2 µm.

Methods

In another aspect, methods for making the disclosed solar cells are provided. In the methods, a variety of deposition techniques may be used to form the individual layers of the solar cell. In a bottom-up approach, each layer of the solar cell is formed sequentially, one on top of the other, starting from a bottom layer (e.g., a first electrode) of the solar cell and ending at a top layer (e.g., a second electrode) of the solar cell (e.g., a second electrode). In a dual, bottom-up/top-down approach, two portions of the solar cell may be made or provided separately and then sandwiched together to form the complete solar cell. By way of illustration, in a dual, bottom-up/top-down approach, a first portion comprising a bottom layer (e.g., a first electrode) may be made or provided and a second portion comprising a top layer (e.g., a second electrode) may be made or provided. Each portion may further comprise additional layers of the solar cell. The two portions are subsequently sandwiched together. As described below, various methods may be used to form the individual layers of the disclosed solar cells.

Various methods may be used to form the electron transporting layer. The Examples below illustrate methods for forming the electron transporting layers based on the deposition techniques of pulsed laser deposition, spin coating and electrospray. For the methods based on electrospray, the electrospray conditions may be adjusted to provide an electron transporting layer comprising nanostructures having a desired shape, diameter and surface area to provide the electron transporting layer having a desired porosity and pore size.

Various methods may be used to form the perovskite sensitizing layers. In one embodiment, a method of forming a perovskite sensitizing layer comprises a first step of exposing the electron transporting layer to a first solution comprising a first perovskite precursor to form a first coating on the surface of the electron transporting layer. The first step may further comprise subsequently annealing the coated electron transporting layer at a first annealing temperature for a first annealing time. The method further comprises a second step of exposing the coated electron transporting layer to a second solution comprising a second perovskite precursor to form a second coating over the surface of the electron transporting layer. The second step may further comprise subsequently annealing the coated electron transporting layer at a second annealing temperature for a second annealing time to form the perovskite sensitizing layer on the surface of the electron transporting layer.

The selection of the first perovskite precursor and the second perovskite precursor depends upon the desired perovskite. For $A_2MX_6$ perovskites, the first perovskite precursor may have Formula IV, AX, wherein A is an alkali metal and X is a halide as described above with respect to Formula I; and the second perovskite precursor may have Formula V, $MX_4$, wherein M is a metal or a metalloid and X is a halide as described above with respect to Formula I.

For $Z_2MX_6$ perovskites, the first perovskite precursor may have Formula VI, ZX, wherein Z is selected from the group consisting of a primary ammonium, an iminium, a secondary ammonium, a tertiary ammonium, and a quaternary ammonium, and X is a halide as described above with respect to Formula II; and the second perovskite precursor may have Formula VII, $MX_4$, wherein M is a metal or a metalloid and X is a halide as described above with respect to Formula II.

For $YMX_6$ perovskites, the first perovskite precursor may have Formula VIII, $YX_2$, wherein Y is $M_b(L)_3$ and X is a halide as described above with respect to Formula III; and the second perovskite precursor may have Formula IX, $MX_4$, wherein M is a metal or a metalloid and X is a halide as described above with respect to Formula III.

Various solvents may be used to form the first solution and the second solution, provided the solvent is capable of sufficiently dissolving the first and second perovskite precursors and is amenable to the selected deposition technique for the exposing steps. Various amounts of the first and second perovskite precursors may be used in the first and second solutions, respectively. Suitable, illustrative solvents and amounts are described in the Examples below.

In the first step, the electron transporting layer may be exposed to the first solution using a variety of deposition techniques. Illustrative deposition techniques include spin coating the first solution, drop casting the first solution and electrospraying the first solution. The deposition conditions under which the electron transporting layer is exposed to the first solution may be adjusted to maximize the coverage of the first perovskite precursor on the surface of the electron transporting layer and/or to provide a desired thickness for the first coating. By way of illustration, the duration of the electrospray controls the thickness of the first coating. Suitable deposition conditions are described in the Examples below. Similarly, the first annealing temperature and first annealing time may be adjusted (e.g., to provide a desired morphology for the coated electron transporting layer). Suitable annealing temperatures and times are described in the Examples below.

In the second step, the coated electron transporting layer may be exposed to the second solution using a variety of deposition techniques, e.g., drop casting the second solution or electrospraying the second solution. The deposition conditions under which the coated electron transporting layer is exposed to the second solution may be adjusted to maximize the coverage of the second perovskite precursor over the surface of the coated electron transporting layer and/or to provide a desired thickness for the second coating. By way of illustration, the number of drops cast over the surface of the coated electron transporting layer may be selected to provide a color of the coated electron transporting layer which is consistent with the formation of the desired perovskite. Similarly, the second annealing temperature and second annealing time may be adjusted (e.g., to provide a desired morphology for the perovskite light sensitizing layer). Suitable annealing temperatures and times are described in the Examples below.

Other methods may be used to form perovskite sensitizing layers. By way of illustration, another method comprises electrospraying a solution comprising the desired perovskite on the surface of the electron transporting layer to form the perovskite sensitizing layer on the surface of the electron transporting layer. The method may further comprise subsequently annealing the perovskite sensitizing layer at an annealing temperature for an annealing time, e.g., to improve crystal morphology.

Any of the annealing steps may be conducted in air or in a non-reactive gas atmosphere.

Other conventional thin film deposition techniques may be used to form the other layers of the disclosed solar cells.

EXAMPLES

Example 1—Method of Making an $A_2MX_6$ Perovskite

A 100 ml beaker was charged with a mixture of aqueous HI (20 ml, 7.58M) and was carefully mixed with $Cs_2CO_3$ (3.258 g, 10 mmol) to afford a concentrated acidic solution of CsI. In a separate 50 mL beaker, $SnI_4$ (3.132 g, 5 mmol) was dissolved in 10 ml of warm absolute EtOH to afford a clear orange solution. Addition of the alcoholic $SnI_4$ solution to the aqueous CsI solution under vigorous stirring led to spontaneous precipitation of a fine black powder. The mixture was stirred for a further 10 min to ensure completion of the reaction after which the solution was filtered-off and washed copiously with EtOH. The yield of the reaction is quantitative including only manipulative losses (~5.5 g of $Cs_2SnI_6$ can be isolated). The compound is both air-stable and moisture-stable.

Example 2—Method of Making a $Z_2MX_6$ Perovskite

The compounds can be prepared in the following way illustrated using the example of $(CH_3NH_3)_2SnI_6$: A 100 ml beaker is charged with a mixture of aqueous HI (20 ml, 7.58M) and is carefully mixed with $CH_3NH_2$ (8.66 ml, 11.55M) to afford a concentrated acidic solution of $CH_3NH_3I$. In a separate 50 mL beaker, SnI4 (3.132 g, 5 mmol) is dissolved in 10 ml of warm absolute EtOH to afford a clear orange solution. Addition of the alcoholic $SnI_4$ solution to the aqueous $CH_3NH_3I$ solution under vigorous stirring leads to spontaneous precipitation of a fine black powder. The mixture is stirred for a further 10 min to ensure completion of the reaction after which the solution is filtered-off and is washed copiously with EtOH. The yield of the reaction is assumed quantitative including only manipulative losses. The compound is expected to be air-stable and moisture-stable.

Example 3—Method of Making a $YMX_6$ Perovskite

The compounds can be prepared in the following way illustrated using the example of $[Ru(bpy)_3]SnI_6$: A 100 ml beaker is charged with a mixture of aqueous HI (2 ml, 7.58M) and EtOH (18 mL) and is carefully mixed with $[Ru(bpy)_3]Cl_2.6H_2O$ (3.743 g, 5 mmol) to afford a concentrated acidic solution of $[Ru(bpy)_3]I_2$. In a separate 50 mL beaker, $SnI_4$ (3.132 g, 5 mmol) is dissolved in 10 ml of warm absolute EtOH to afford a clear orange solution. Addition of the alcoholic $SnI_4$ solution to the $[Ru(bpy)_3]I_2$ solution mixture under vigorous stirring leads to spontaneous precipitation of a fine black powder. The mixture is stirred for a further 10 min to ensure completion of the reaction after which the solution is filtered-off and washed copiously with EtOH. The yield of the reaction is assumed quantitative including only manipulative losses. The compound is expected to be both air-stable and moisture-stable.

Example 4—Method of Making a Metal Oxide Electron Transporting Layer

The $TiO_2$ layer was coated on a conductive (FTO) substrate using an electrospray method After electrospraying process, the as-prepared $TiO_2$ sphere coated electrode was heated to 130° C. from room temperature in 30 min.

Example 5—Method of Making a Solar Cell with an $A_2MX_6$ Perovskite

Figure 2A:
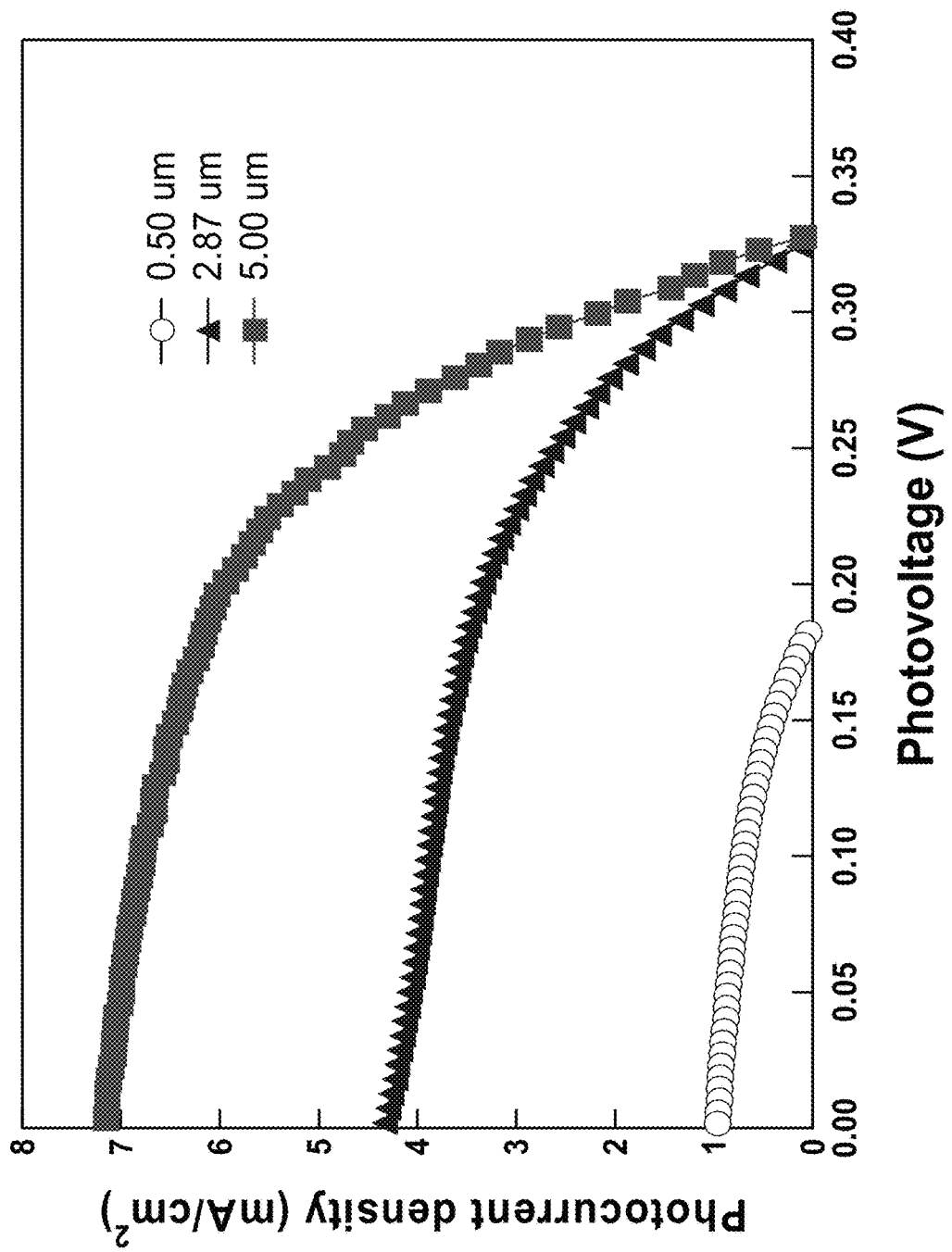
FIGS. 2A-B show the solar performance of the solar cell of FIG. 1 as a function of the thickness of the light sensitizing layer.
Figure 2B:
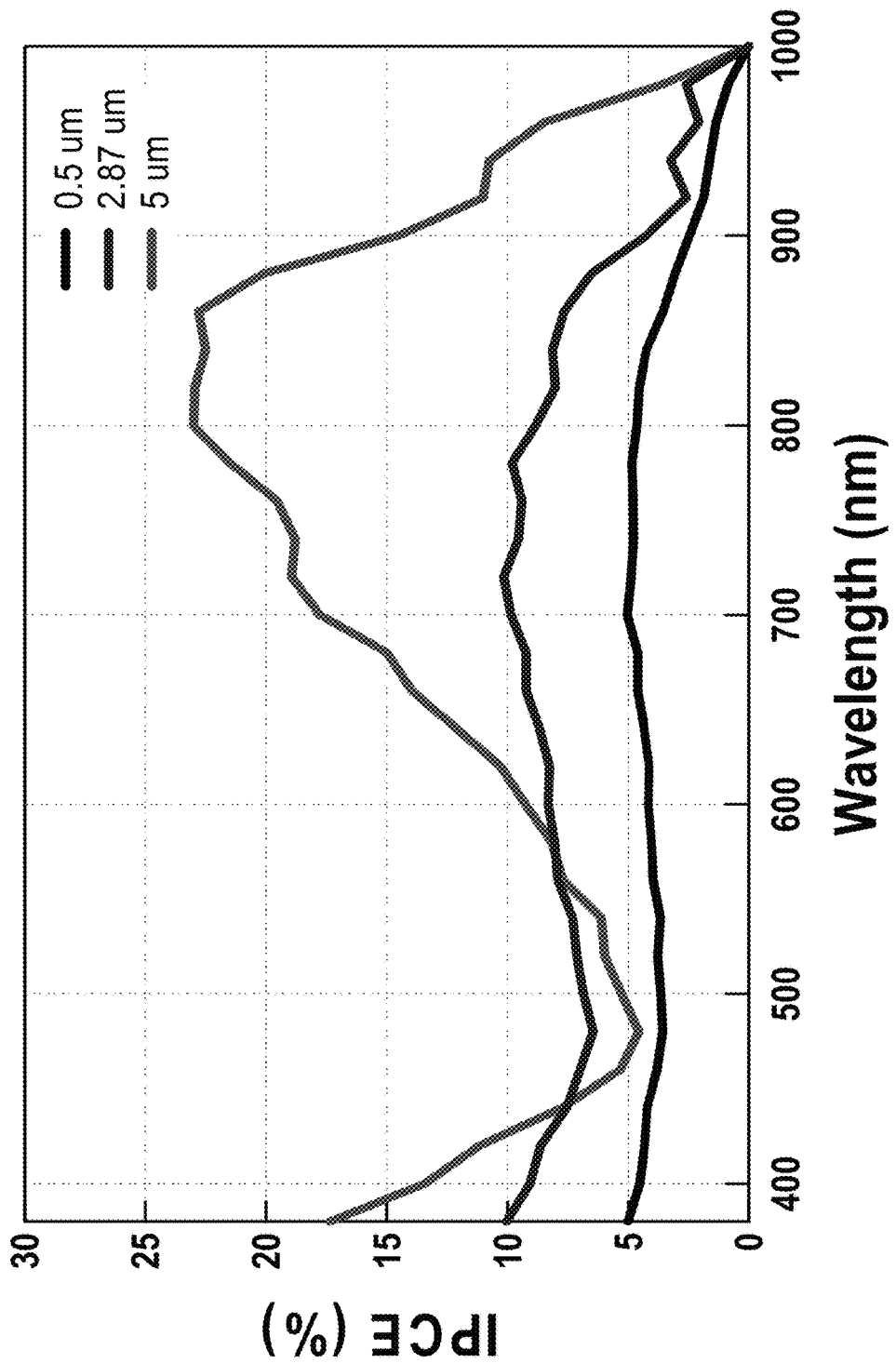

This method is illustrated in FIG. 1. Sequential deposition of $Cs_2SnI_6$ To coat different thickness of $Cs_2SnX_6$ layers, a novel two-step coating process (Electrospraying technique) has been developed in our laboratory. At the first step, a CsI solution was prepared dissolving 2 g of CsI powder (Aldrich, 99.9%) in 400 ml of the mixture solvent of deionized water and isopropanol (deionized water:isopropanol=0.1:1 v/v). After sonication for 1 hour, the solutions were loaded into a plastic syringe equipped with a 27-gauge stainless steel needle. The spinning rate was controlled by a syringe pump (KD Scientific Model 220) at 35~50 µL/min. The electric field of 12~15 kV was applied between a metal orifice and the ground at a distance of 10 cm by a power supply (BERTAN SERIES 205B). The CsI solution was directly electrosprayed on $TiO_2$ sphere. The duration of electrospraying controls the thickness of CsI layers and this film was heated in a box furnace at temperatures ranging from 100° C. to 500° C. for 20 min in ambient atmosphere. In the second step, a solution of Tin(IV) iodide ($SnI_4$) in ethanol (0.1 g ml$^{-1}$) was then introduced into CsI layer by drop coating. The drop process was repeated several times until the color of covered CsI layer was changed to black, indicating the formation of the perovskite black $Cs_2SnI_6$ phase. This black film was heated in air at 110° C. for 20 min. Scanning electron microscope (SEM) images of the electrosprayed $Cs_2SnI_6$ layer were obtained. The JV characteristics for solar cells having different thicknesses of the $Cs_2SnI_6$ were determined and are shown in Table 5, below. FIGS. 2A and 2B further illustrate the solar performance of the solar cells as a function of the thickness of the $C_2SnI_6$ layer.

TABLE 5

JV characteristics for solar cells with a light sensitization layer of $Cs_2SnI_6$.

| Sensitizer | Thickness (nm) | $V_{OC}$ (V) | $J_{SC}$ (mA/cm$^2$) | FF (%) | EFF (%) |
|---|---|---|---|---|---|
| $Cs_2SnI_6$ | 500 | 0.196 | 0.961 | 41.0 | 0.077 |
| | 1830 | 0.253 | 2.30 | 52.3 | 0.305 |
| | 2780 | 0.330 | 4.38 | 45.2 | 0.653 |

TABLE 5-continued

JV characteristics for solar cells with a light sensitization layer of $Cs_2SnI_6$.

| Sensitizer | Thickness (nm) | $V_{OC}$ (V) | $J_{SC}$ (mA/cm$^2$) | FF (%) | EFF (%) |
|---|---|---|---|---|---|
| | ~5000 | 0.329 | 7.18 | 52.4 | 1.24 |
| | 10000 | 0.307 | 5.34 | 24.8 | 0.407 |

Example 6—Method of Making a Solar Cell with a $Z_2MX_6$ Perovskite

The solar cells can be prepared in the following way illustrated using the example of $(CH_3NH_3)_2SnI_6$: To coat different thickness of $(CH_3NH_3)_2SnI_6$ layers, a novel two-step coating process (Electrospraying technique) is developed. As the first step, a $CH_3NH_3I$ solution is prepared by dissolving 1 g of $CH_3NH_3I$ powder in 50 ml of N,N-dimethylformamide (DMF). After stirring, the solutions are loaded into a plastic syringe equipped with a 25-gauge stainless steel needle. The spinning rate is controlled by a syringe pump (KD Scientific Model 220) at 25 μL/min. The electric field of 12~15 kV is applied between a metal orifice and the FTO substrate at a distance of 10 cm by a power supply (BERTAN SERIES 205B). The duration of electrospraying controls the thickness of $CH_3NH_3I$ layers and this film is heated at 130° C. for 10 min in ambient atmosphere. In the second step, a solution of Tin(IV) iodide ($SnI_4$) in ethanol (0.1 g ml$^{-1}$) is then be introduced into the $CH_3NH_3I$ layer by drop casting. The drop process is repeated several times until the color of covered $CH_3NH_3I$ layer change to blacks, indicating the formation of the perovskite black $(CH_3NH_3)_2SnI_6$ phase. This black film is heated in air at 110° C. for 5 min.

Example 7—Method of Making a Solar Cell with a $YMX_6$ Perovskite

The solar cells can be prepared in the following way illustrated using the example of $[Ru(bpy)_3]SnI_6$: To coat different thickness of $[Ru(bpy)_3]SnI_6$ layers, a novel two-step coating process (Electrospraying technique) is developed. As the first step, a $[Ru(bpy)_3]I_2$ solution is prepared by dissolving 1 g of $[Ru(bpy)_3]I_2$ powder in 50 ml of N,N-dimethylformamide (DMF). After stirring, the solutions are loaded into a plastic syringe equipped with a 25-gauge stainless steel needle. The spinning rate is controlled by a syringe pump (KD Scientific Model 220) at 25 μL/min. The electric field of 12~15 kV is applied between a metal orifice and the FTO substrate at a distance of 10 cm by a power supply (BERTAN SERIES 205B). The duration of electrospraying controls the thickness of $[Ru(bpy)_3]I_2$ layers and this film is heated at 130° C. for 10 min in ambient atmosphere. In the second step, a solution of Tin(IV) iodide ($SnI_4$) in ethanol (0.1 g ml$^{-1}$) is then introduced into the $[Ru(bpy)_3]I_2$ layer by drop casting. The drop process is repeated several times until the color of covered $[Ru(bpy)_3]I_2$ layer changes to black, indicating the formation of the perovskite black $[Ru(bpy)_3]SnI_6$ phase. This black film is heated in air at 110° C. for 5 min.

Figure 3A:
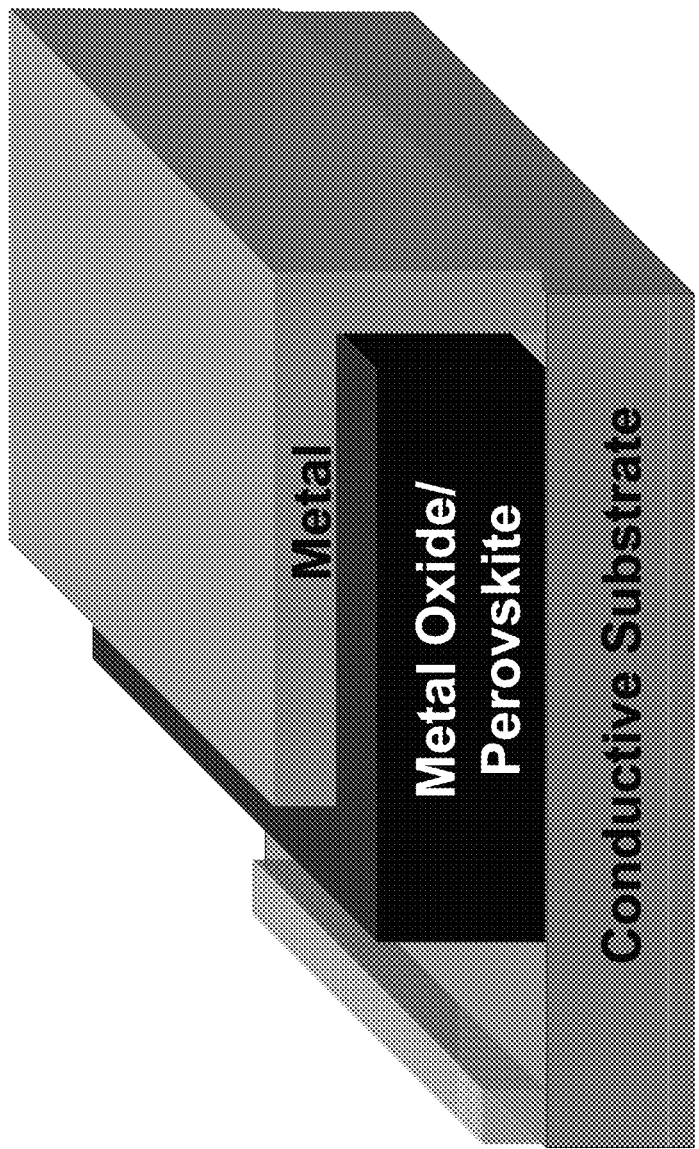
FIGS. 3A-C illustrate a solar cell comprising a light sensitizing layer of perovskite having the formula $A_2MX_6$ according to an illustrative embodiment in which the metal oxide layer was formed using pulsed laser deposition.
Figure 3B:
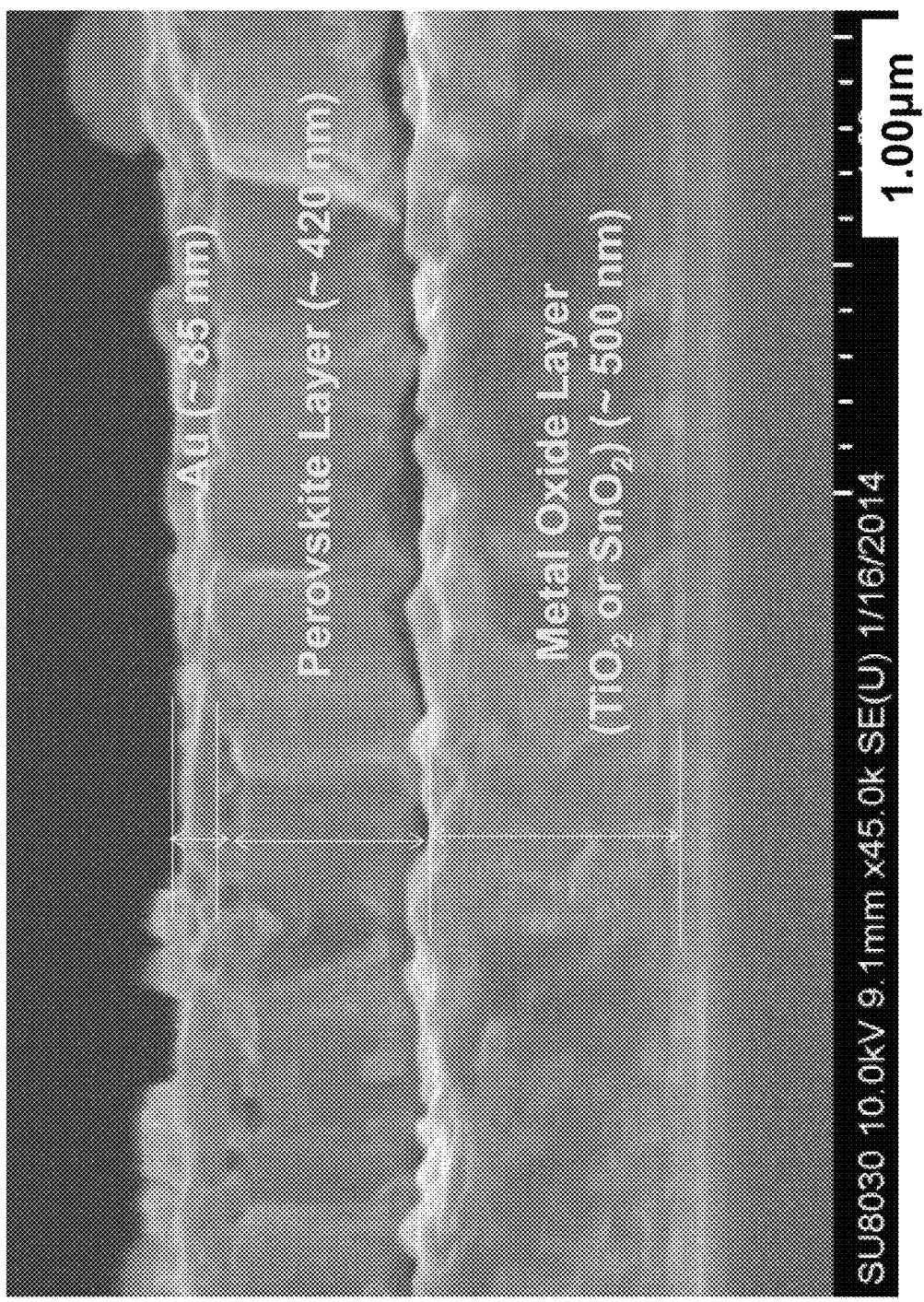
Figure 3C:
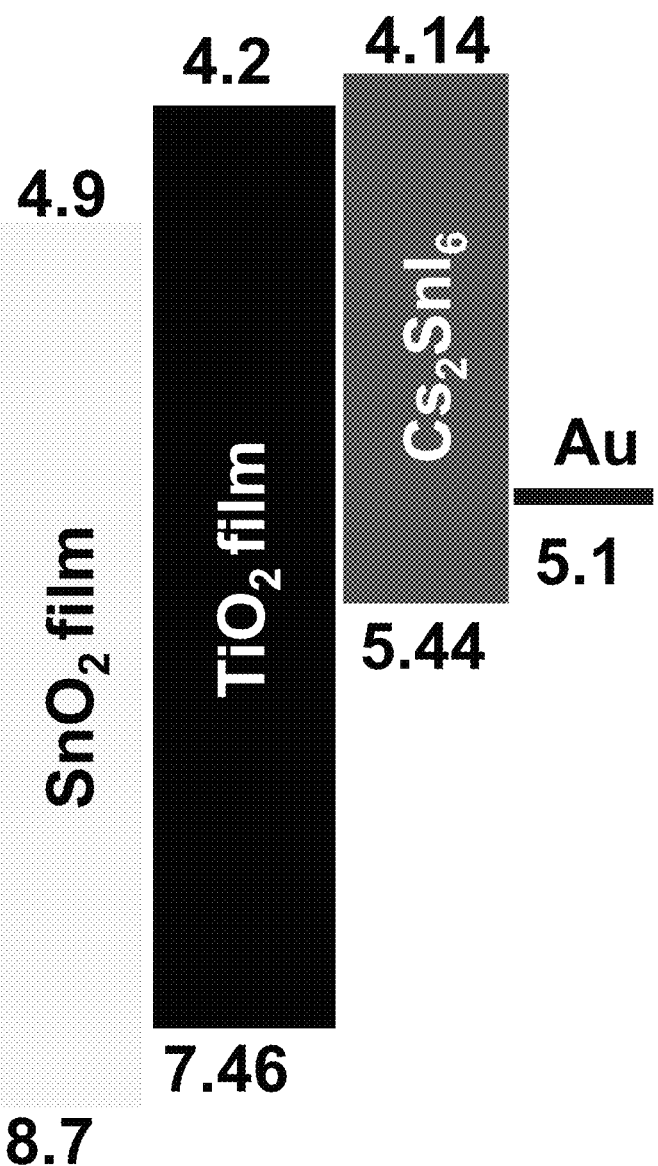

Example 8—Method of Making a Solar Cell with an $A_2MX_6$ Perovskite and a PLD-Deposited Electron Transporting Layer A $TiO_2$ or a $SnO_2$ layer was deposited via pulsed laser deposition (PLD). Next, $Cs_2SnI_6$ solution (1 wt % $Cs_2SnI_6$ powder dissolved in DMF) was electrosprayed (e-sprayed) onto the $TiO_2/SnO_2$ layer. For the e-spray condition, the solutions were loaded into a plastic syringe equipped with a 25-gauge stainless steel needle. The spinning rate was controlled by a syringe pump (KD Scientific Model 220) at 25 μL/min. The electric field of 12~15 kV was applied between a metal orifice and the FTO substrate at a distance of 10 cm by a power supply (BERTAN SERIES 205B). The duration of electrospraying controls the thickness of $Cs_2SnI_6$ layers and this film was heated at 130° C. for 5 min in ambient atmosphere. FIG. 3A illustrates the devices consisting of the following layer structure: conductive substrate/metal oxide (PLD method)/perovskite sensitizer/gold(Au). FIG. 3B shows a SEM image of a cross-section of one of the devices. FIG. 3C illustrates the energy level of each layer in the devices.

Figure 4A:
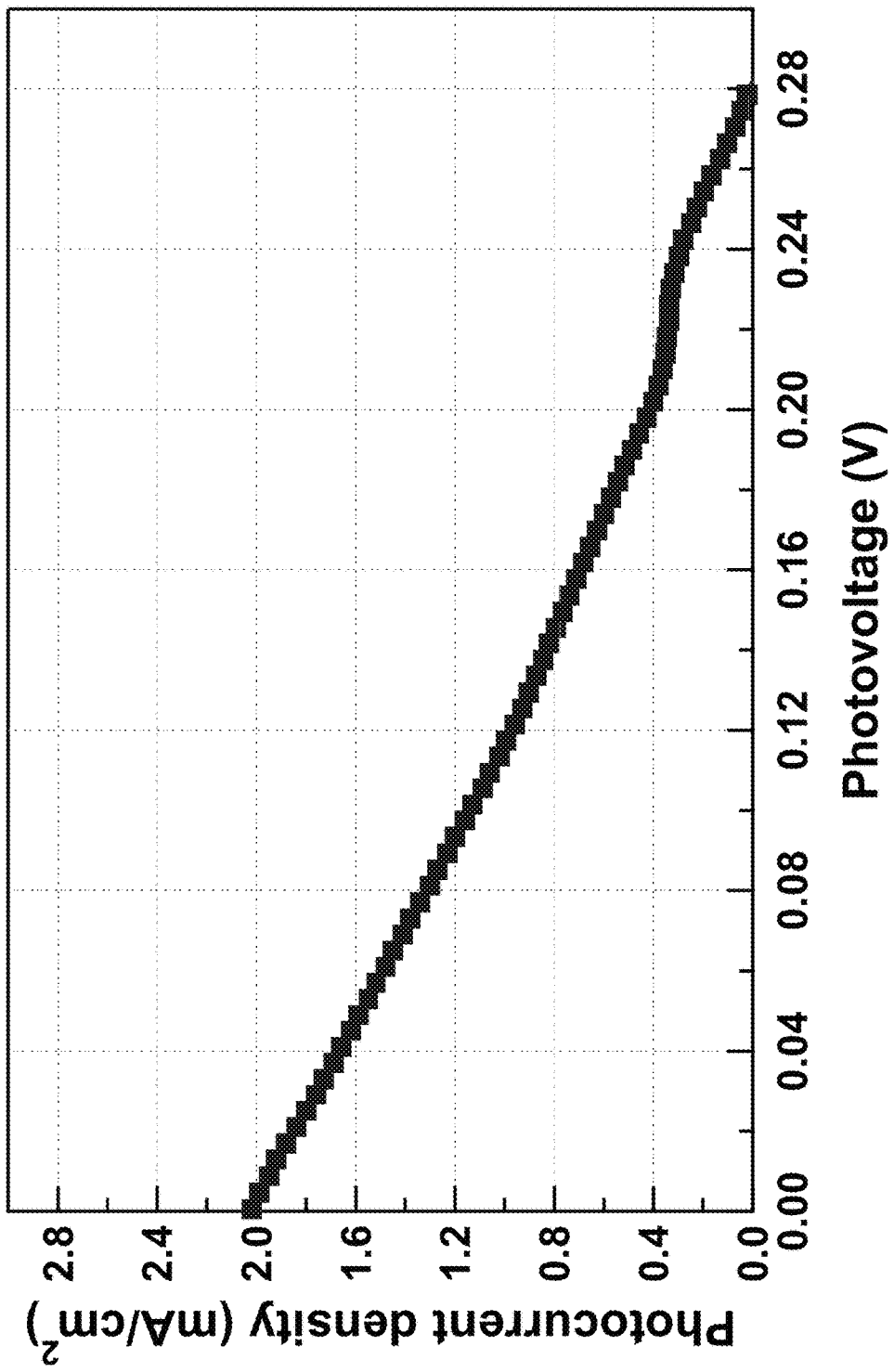
FIGS. 4A-B show the solar performance of solar cells according to FIG. 3A.
Figure 4B:
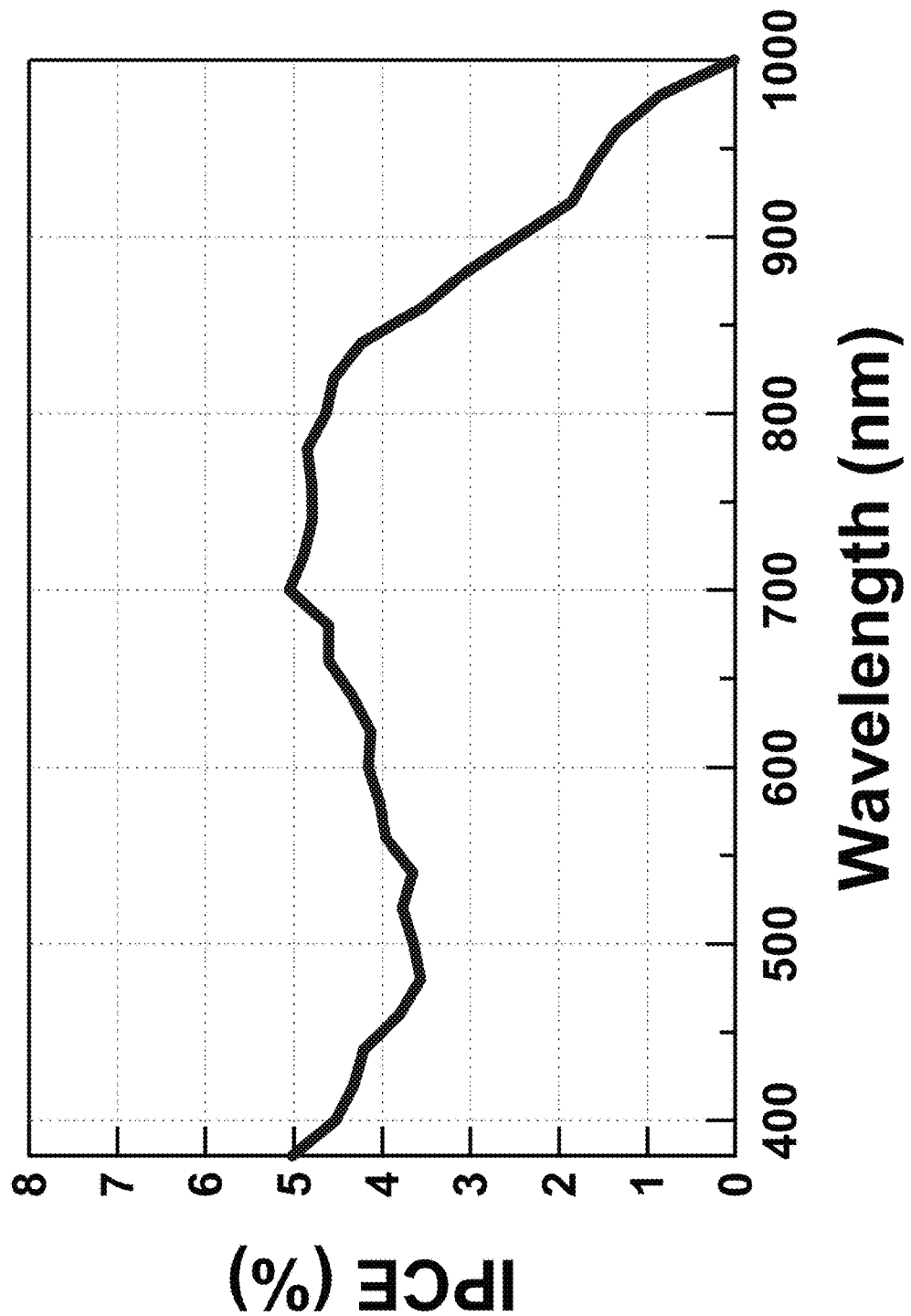

The JV characteristics for the two solar cells were determined and are shown in Table 6, below. FIGS. 4A and 4B further illustrate the solar performance of the solar cells.

TABLE 6

JV characteristics for solar cells comprising a light sensitization layer of $Cs_2SnI_6$.

| | Deposition Technique | | JV characteristics | | | |
|---|---|---|---|---|---|---|
| Cell Structure | Metal Oxide | Perovskite | $V_{OC}$ (V) | $J_{SC}$ (mA/cm$^2$) | FF (%) | EFF (%) |
| $TiO_2$/ $Cs_2SnI_6$/Au | PLD | E-Spraying | 0.184 | 0.05 | 35.1 | 0.03 |
| $SnO_2$/ $Cs_2SnI_6$/Au | PLD | E-Spraying | 0.2823 | 2.03 | 20.4 | 0.117 |

Example 9—Method of Making a Solar Cell with a Spin-Coated Electron Transporting Layer A solar cell device was made consisting of the following layer structure: conductive substrate (electrode)/metal oxide (thin layer by spin-coating method)/perovskite sensitizer/LPAH carbon (by electrospraying)/LPAH coated conductive substrate. ("LPAH" is large-effective-surface-area poly aromatic hydrocarbon.)

The layers of the device were made as follows. For the metal oxide (thin layer by spin-coating method), a solution of 0.2M titanium bis(ethyl acetoacetate) diisopropoxide ($C_{18}H_{34}O_8Ti$, Adrich, 99.9%) in 1-butanol (Adrich, 99.8%) was prepared for compact $TiO_2$ blocking layer. A drop of a blocking layer solution was set on the center of a conducting substrate and flattened using a spin-coating method at 2000 rpm for 60 sec. These films were sintered at 450° C. for 30 min.

For the LPAH carbon (by electrospraying), the LPAH layer was made by a hydrogen arc and the carbon solutions were prepared by dispersing 1 wt % of these carbon materials in ethanol through sonication and stirring for 1 hour. This solution was electrosprayed on the perovskite sensitizer and heated at 110° C. for 20 min.

For the LPAH coated conductive substrate, as a cathode, Pluronic P-123 (BASF Corporation) were dissolved in water/acetic acid solutions (10 wt %) by sonication. The carbon solutions were prepared by mixing 0.1 g of these carbon materials and 1000 μl of surfactant solution through stirring for 20 hours. This solution was used to coat the FTO glass substrate, and in a similar way the solution was dried thoroughly at 400° C. for 20 minutes.

Figure 5B:
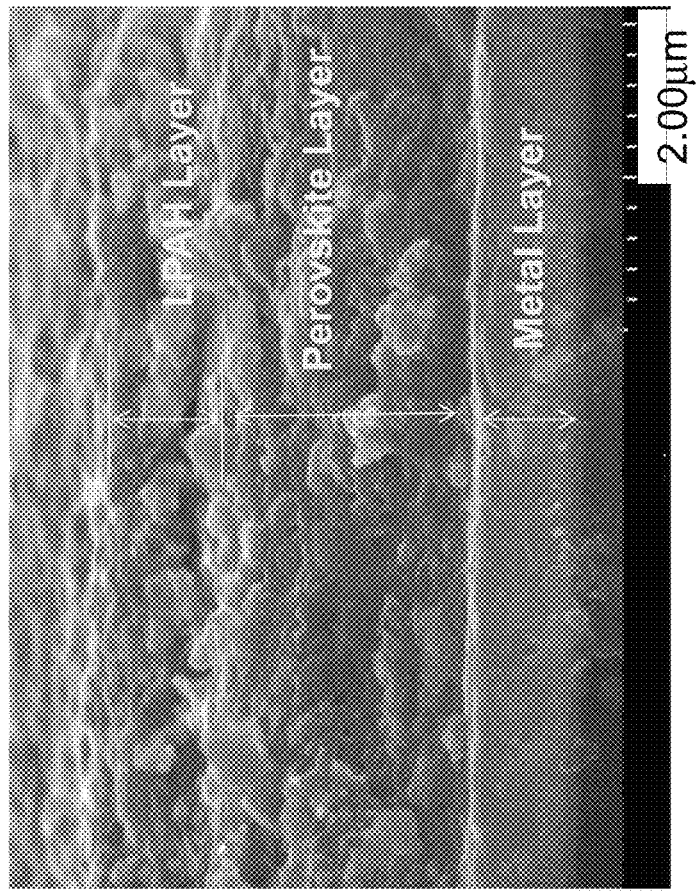
FIGS. 5A-B illustrate a solar cell comprising a light sensitizing layer of perovskite according to an illustrative embodiment in which the metal oxide layer was formed using a spin-coating method.
Figure 5A:
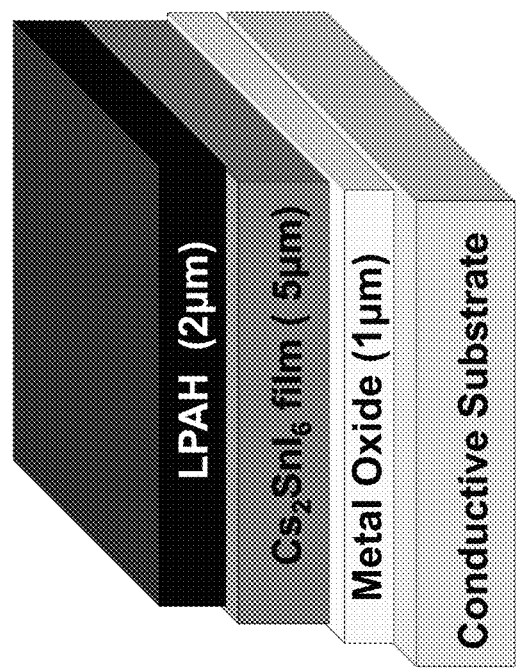

FIG. 5A illustrates the solar cell device. FIG. 5B shows a SEM image of a cross-section of the device.

In this Example and others, the solar cell comprises a layer of LPAH. The large-effective-surface-area poly aromatic hydrocarbon (LPAH) produced by a hydrogen arc-system was successfully used as an efficient catalytic layer for a counter electrode in a DSSC. The LPAH particles have a uniform size of ~10 nm and they exhibit more than 3-fold higher specific surface area and 45% enhanced pore diameters compared with that of CB particles (carbon black, commercial carbon). The increased surface to volume ratio of LPAH layer makes it possible to accelerate the charge specie diffusion and catalytic reactions. Therefore, a LPAH CE based DSSC showed superior electrocatalytic properties and the overall energy efficiency was close to that of the platinum electrode. The use of a P123 surfactant for dispersing LPAH particles helped to make the LPAH film much more uniform and a denser material. In addition to replacing Pt with LPAH as the catalyst, the FTO substrate for CE was also replaced by a graphite film to further reduce the cell internal resistance and thus improving cell efficiency. In this way an all carbon CE delivers near 9% of energy conversion efficiency as measured with a masked frame. This efficiency is a 20.7% improvement compared to the case of Pt/FTO counter electrode based DSSC. (See Lee, B.; Buchholz, D. B.; Chang, R. P. H., An all carbon counter electrode for dye sensitized solar cells. *Energy & Environmental Science* 2012, 5 (5), 6941-6952.)

Example 10—Method of Making a Solar Cell with a Mesoporous Electron Transporting Layer A solar cell device was made consisting of the following layer structure: conductive substrate (electrode)/metal oxide (mesoporous $TiO_2$ by electrospray method)/perovskite sensitizer (by electrospraying)/metal oxide and LPAH coated conductive substrate).

In a typical dye-sensitized solar cell (DSSC), the titanium oxide ($TiO_2$) layer is made porous to have an increased surface area. Such a porous $TiO_2$ layer is prepared by dispersing in water or organic solvent about 20 nm-sized anatase crystalline $TiO_2$ nanoparticle produced by hydrothermal synthesis of titanium alkoxide, adding an organic polymer or oligomer binder to produce a paste, and coating the paste on a transparent conductive substrate from blade or screen printing coating, which evaporate or burn off when the $TiO_2$ film is sintered at about 450~500° C. However, the conventional methods using an organic binder have a problem in that the short-circuit current density deteriorates due to the increases in the interfacial inter-particle resistance. Further, after the organic binder is removed by drying and sintering procedures, the resulting titanium oxide layer often undergoes cracking, and the inter-particle resistance increases. Moreover, the titanium oxide later formed by the conventional method has a very dense structure and a low porosity so that a solid hole transport materials (HTMs) cannot easily penetrate the $TiO_2$ layer, resulting in a drastic decrease in the photoelectric conversion efficiency. Therefore, it is required to develop a metal oxide layer having a high specific surface area, a high porosity, and a large pore size, which has excellent contact properties even after a low-temperature sintering process and has a low interfacial resistance.

For the mesoporous $TiO_2$ metal oxide layer, the following electrospraying method was used. To obtain a continuous fluid jet during the electro-spraying without avoiding clogging at a tip, suspensions are required to be well-dispersed stable system. For making a well-dispersed colloidal precursor, small sized $TiO_2$ nanoparticle was prepared. A quantity (100 mL) of titanium isopropoxide (97%, Aldrich Chemical Co.) was added, dropwise and at room temperature, to 800 mL of a 0.1M nitric acid solution under vigorous stirring. A white precipitate was heated to 80° C. and stirred vigorously for 12 h, to achieve peptization (i.e., destruction of the agglomerates and redispersion into primary particles). The solution was hydrothermally treated by autoclaving the low-pH titanate suspension at 240° C. (or 230° C.) for 12 h. Aqueous solvent in the autoclaved $TiO_2$ colloid solution was replaced by ethanol. The replaced solution was loaded into a syringe equipped with a 27-gauge stainless steel needle. The spaying rate (25 µL/min) was controlled using a syringe pump (KD Scientific model 220). The electric field (12-15 kV) was applied between a metal orifice and the aluminum foil at a distance of 10 cm using a power supply (BERTAN Series 230) and was electrosprayed onto conductive substrate.

Photovoltaic cells incorporating the organic-inorganic tin halide perovskite compounds as a photoactive material can take on a variety of forms. Generally, however, the cells will comprises a first electrode comprising an electrically conductive material, a second electrode comprising an electrically conductive material, a light absorbing layer comprising the organic-inorganic tin halide perovskite compounds disposed between (including partially between) and in electrical communication with the first and second electrodes, and an organic hole transporting material disposed between (including partially between) the first and second electrodes and configured to facilitate the transport of holes (that is, to provide preferential transport of holes relative to electrons) generated in the light absorbing layer to one of the first or second electrodes.

Figures 6A, 6B:
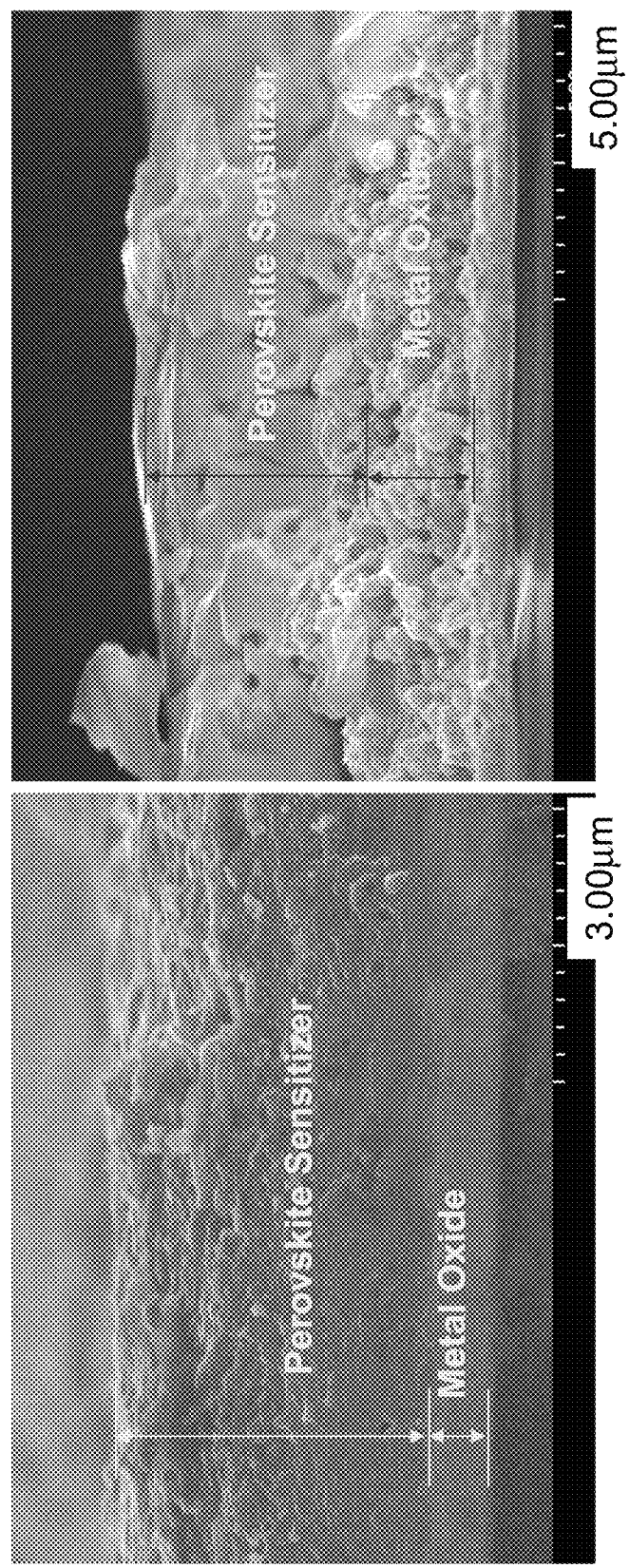
FIG. 6A shows a SEM image of a cross-section of a solar cell comprising a light sensitizing layer of perovskite according to an illustrative embodiment in which the metal oxide layer was formed using a spin-coating method.
FIG. 6B shows a SEM image of a cross-section of a solar cell comprising a light sensitizing layer of perovskite according to an illustrative embodiment in which the mesoporous metal oxide layer was formed using an electrospray method.
Figure 6C:
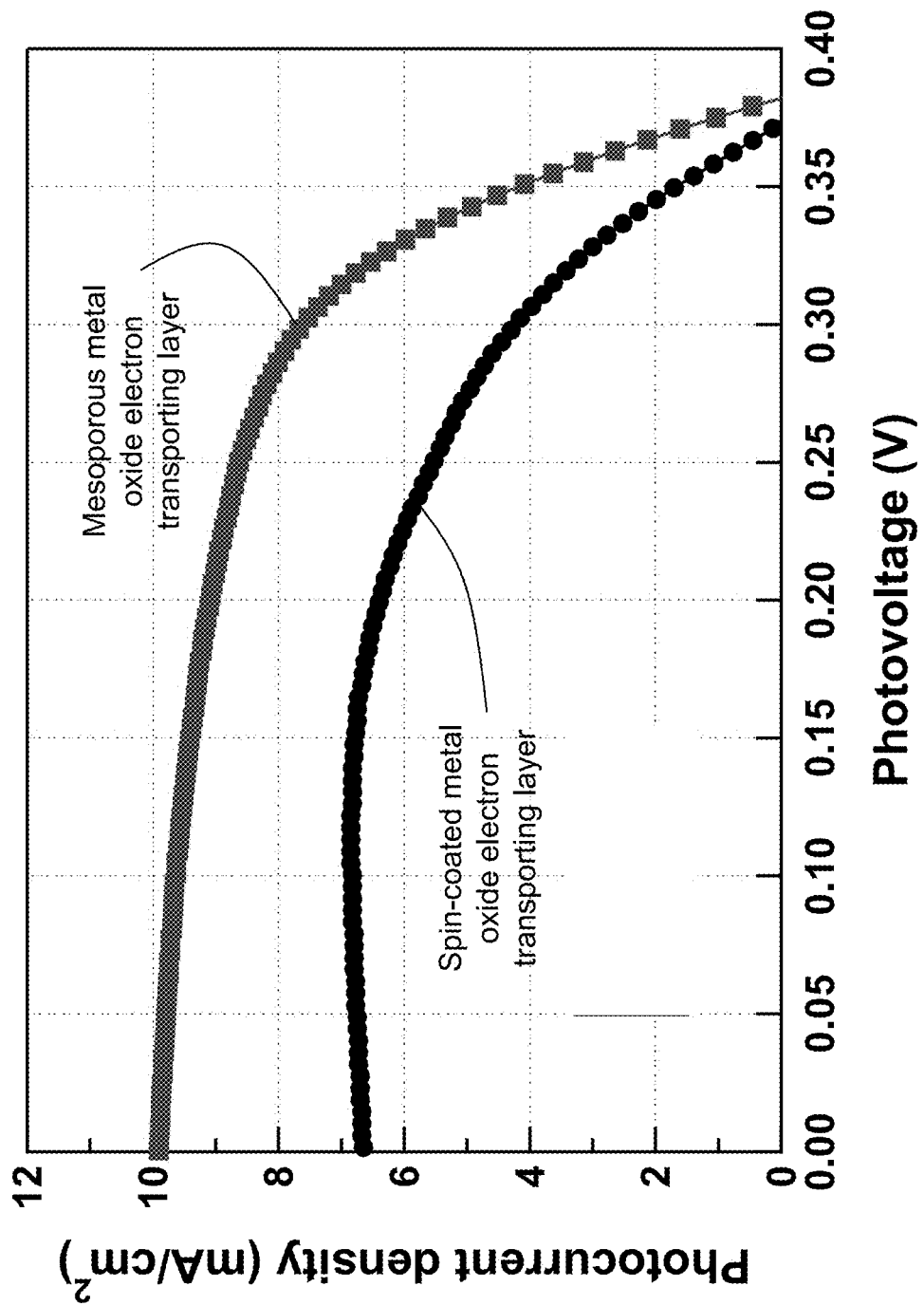
FIG. 6C compares the JV characteristics for the solar cells of FIGS. 6A and 6B, respectively.

FIG. 6A shows a SEM image of a cross-section of a solar cell made according to Example 9 (spin-coated metal oxide layer). FIG. 6B shows a SEM image of a cross-section of a solar cell made according to this example (electrosprayed mesoporous metal oxide layer). FIG. 6C compares the JV characteristics for the two solar cells of FIGS. 6A and 6B, respectively. Table 7, below, also compares the JV characteristics of the two solar cells.

TABLE 7

JV characteristics for solar cells comprising a light sensitization layer of $Cs_2SnI_6$ and either a spin-coated metal oxide layer or an electrosprayed mesoporous metal oxide layer.

| Metal Oxide Type | $TiO_2$ Thickness (µm) | $Cs_2SnI_6$ Thickness (µm) | $V_{OC}$ (V) | $J_{SC}$ (mA/cm$^2$) | FF (%) | EFF (%) |
|---|---|---|---|---|---|---|
| Spin-Coated | ~0.68 | ~4.1 | 0.373 | 6.65 | 56.0 | 1.39 |
| Electrosprayed, Mesoporous | ~1.93 | ~4.52 | 0.382 | 9.91 | 60.6 | 2.30 |

Example 11—Morphology of Electrosprayed $TiO_2$

Figure 7:
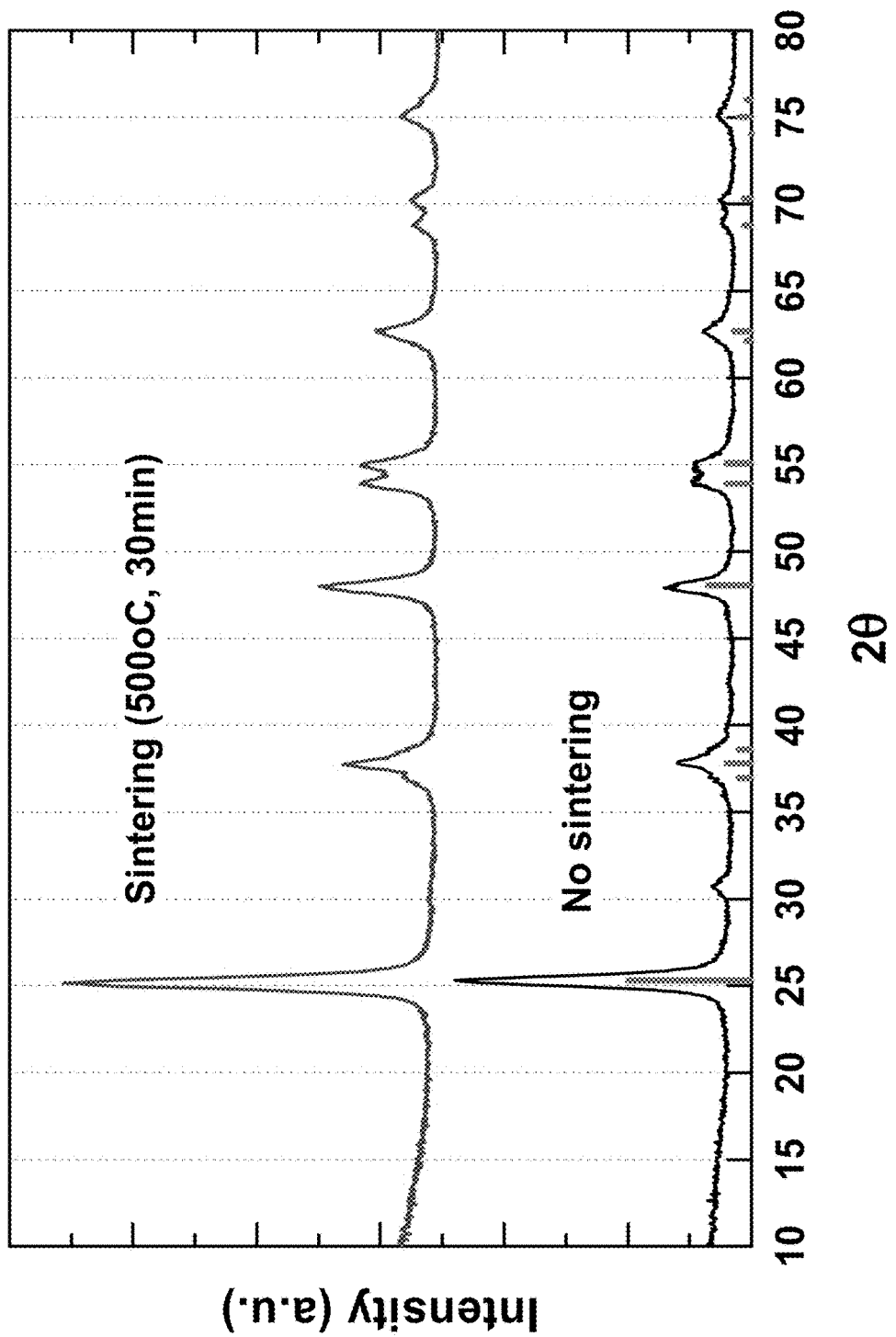
FIG. 7 shows XRD spectra of an electrosprayed mesoporous $TiO_2$ layer according to an illustrative embodiment.
Figure 8B:
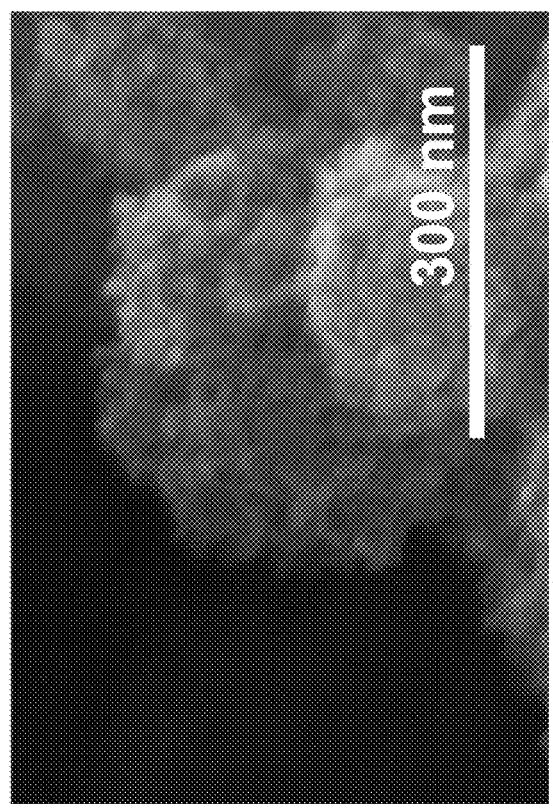
FIG. 8B shows a higher magnification of a portion of the SEM of FIG. 8A.
Figure 8A:
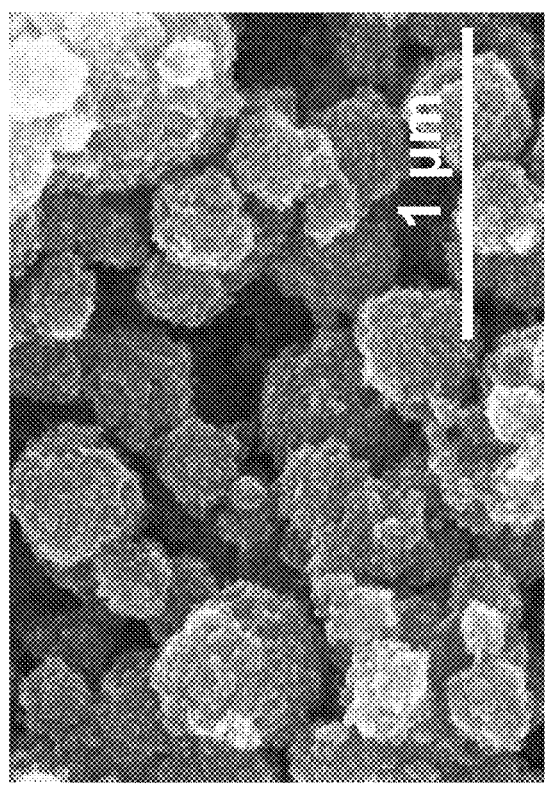
FIG. 8A shows an SEM image of the $TiO_2$ nanospheres of an electrosprayed mesoporous $TiO_2$ layer according to an illustrative embodiment.
Figure 9:
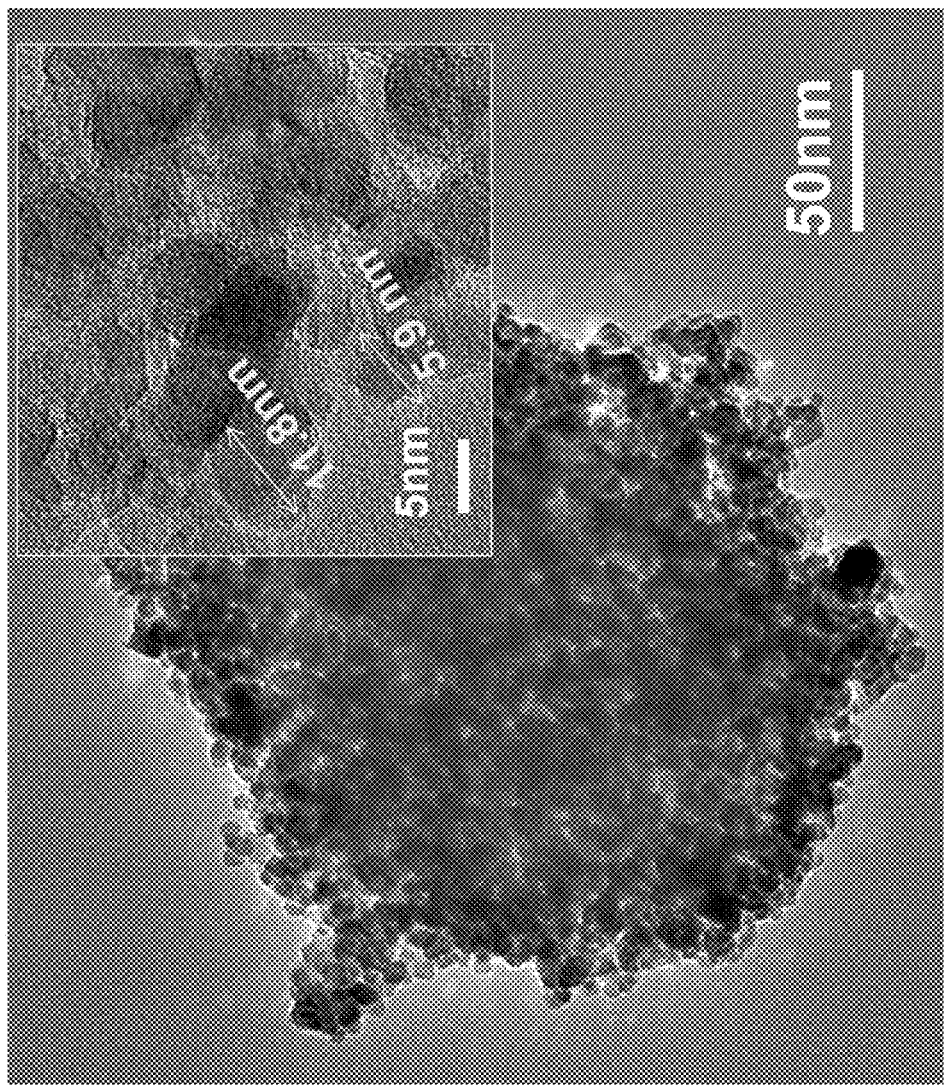
FIG. 9 shows TEM images of the $TiO_2$ nanospheres of an electrosprayed mesoporous $TiO_2$ layer according to an illustrative embodiment.

The morphology of E-sprayed $TiO_2$ was investigated by using a field-emission scanning electron microscope (SEM, S4800, Hitachi) and JEOL-2010 TEM (JEOL, Japan). The XRD spectra are shown in FIG. 7. E-sprayed $TiO_2$ film shows a mesoporous sphere shape which have a range of diameters approximately 100-500 nm, formed by crystallized ~10 nm particle. SEM and transmission electron microscope (TEM) images of $TiO_2$ spheres are shown in FIGS. 8A-B and 9, respectively. $N_2$ adsorption-desorption isotherm and the pore size distribution curve at 77 K of both $TiO_2$ spheres (SPs) and nanoparticle (NPs) were obtained. The SPs show a type-IV isotherm as well as an increase in the adsorbed amount at totally relative pressure, indicating the existence of mesopores in the sample. The surface area and pore sizes calculated with the Brunauer-Emmett-Teller (BET) and Barrett-Joyner-Halenda (BJH) models from the adsorption branches are also listed in Table 8, below. (See Lee, B.; Stoumpos, C. C.; Zhou, N.; Hao, F.; Malliakas, C.; Yeh, C.-Y.; Marks, T. J.; Kanatzidis, M. G.; Chang, R. P. H., Air-Stable Molecular Semiconducting Iodosalts for Solar Cell Applications: Cs2SnI6 as a Hole Conductor. *Journal of the American Chemical Society* 2014, 136 (43), 15379-15385.) The measured specific surface area of $TiO_2$ SPs exhibit a specific surface area of 114.0 $m^2$ $g^{-1}$, ~2.1 higher than that of similar amount of $TiO_2$ NPs electrode (53.3 $m^2$ $g^{-1}$). Furthermore, the total BJH mesopore volume of sphere and maximum pore radius is 0.723 $cm^3$ $g^{-1}$ and 9.01 nm, respectively, while particle shows the pore volume of 0.348 $cm^3$ $g^{-1}$ and maximum pore radius of 1.06 nm. Therefore, in this study, the use of inorganic HTMs and metal oxide with larger sensitizer surface coverage and the ease of permeation through the $TiO_2$ pore had a synergistic effect on boosting the solar cell performance.

TABLE 8

JV characteristics for solar cells comprising mesoporous $TiO_2$ for the case of a traditional DSSC using liquid electrolyte.

| $TiO_2$ structure | Particle Size (nm) | Surface Area ($m^2$/g) | Maximum Pore radius (nm) | Cumulative Pore Volume ($cm^3$/g) | JV characteristics | | | |
|---|---|---|---|---|---|---|---|---|
| | | | | | $V_{OC}$ (V) | $J_{SC}$ (mA/$cm^2$) | FF (%) | EFF (%) |
| Nanoparticle | ~25 | 53.29 | 1.06 | 0.348 | 0.803 | 14.8 | 68.7 | 8.16 |
| Nanosphere | ~25 | 89.8 | 12.4 | 0.798 | 0.813 | 16.0 | 67.3 | 8.74 |
| | ~10 | 114.0 | 9.01 | 0.723 | 0.821 | 17.1 | 73.0 | 10.2 |

Example 12—Solar Cells Comprising $A_2MX_6$ Perovskite Light Sensitizing Layers

Solar cells comprising $A_2MX_6$ absorbers, i.e., perovskite light sensitizing layers, were made.

Figure 13:
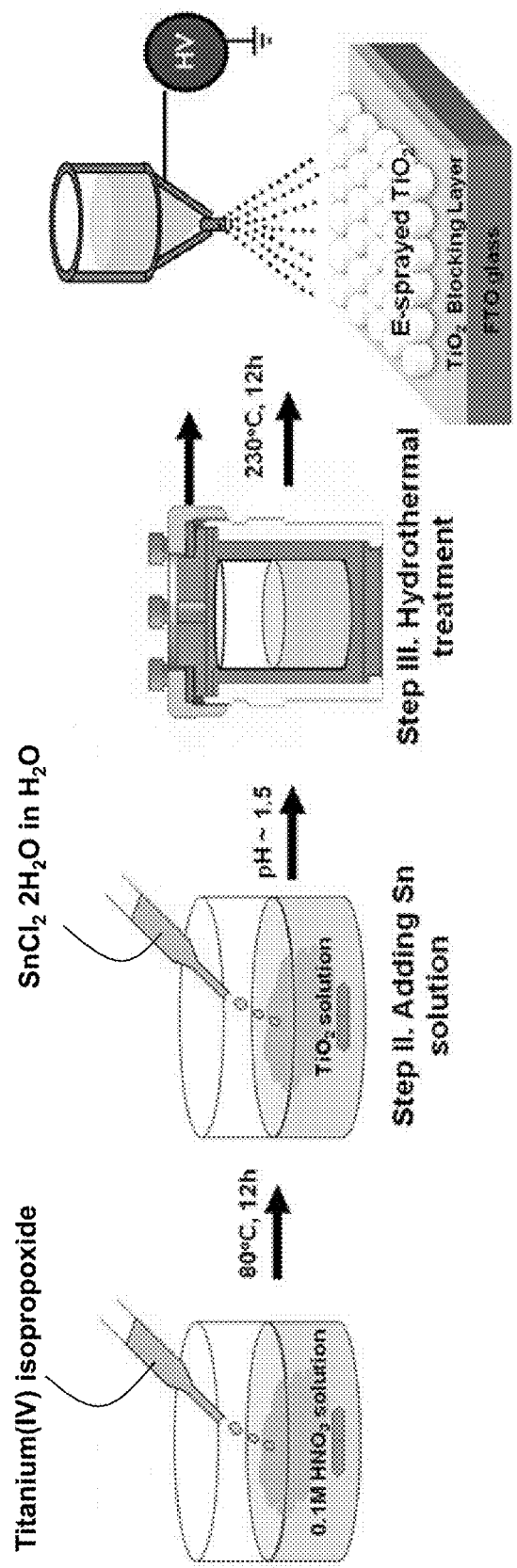
FIG. 13 illustrates a method of forming a mesoporous electron transporting layer (e.g., Sn-doped $TiO_2$) according to an illustrative embodiment.

FIG. 13 illustrates the method of forming a Sn-doped $TiO_2$ electrode substrate (i.e., the formation of an electron transporting layer on a conductive substrate) for the solar cells. As shown in FIG. 13, Sn-doped mesoporous electron transporting layers comprising $TiO_2$ nanoparticles (~20 nm) were synthesized using a hydrothermal process. All manipulations were performed in air unless otherwise noted. The starting materials titanium isopropoxide (Ti(OiPr)$_4$) (97%), 0.1 g Tin(II) chloride dehydrate ($SnCl_2.2H_2O$) and Nitric acid ($HNO_3$) (70%) were purchased from Sigma Aldrich; all materials were used as received. The details of the hydrothermal process have been described in Example 11. However, in this Example, $SnCl_2.2H_2O$ (e.g., 0.1 g) in $H_2O$ (e.g., 50 mL) was added to the $TiO_2$ solution for Sn-doping prior to the hydrothermal treatment. The weight percent of $SnCl_2.2H_2O$ in the solution was varied (e.g., between about 2 wt % and about 10 wt %). Sn-doped $TiO_2$ showed that $Sn^{4+}$ ions can be incorporated linearly into $TiO_2$ lattices, accompanied by a phase transformation from anatase to rutile depending upon the amount of the dopant. As illustrated in FIG. 12, the molar ratio of Sn plays an important role on the band gap change. When the molar ratio of Sn is in the range of from 0.02 to 0.50, the band gap is changed. Compared with the case of pure rutile, the substitution of Sn for O raises the valence band maximum by about 0.15 eV and lowers the conduction band edge by about 0.32 eV.

Figure 14C:
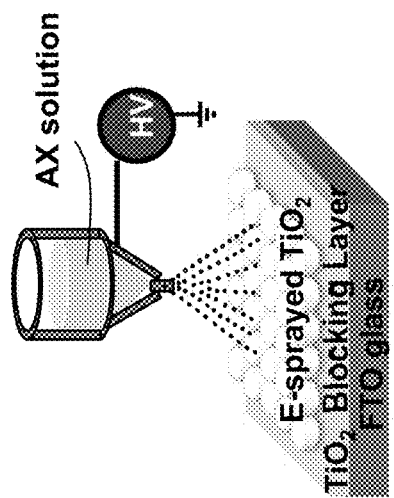
FIGS. 14A-C illustrate methods of treating an electron transporting layer with a first perovskite precursor (e.g., AX) according to illustrative embodiments.
Figure 14B:
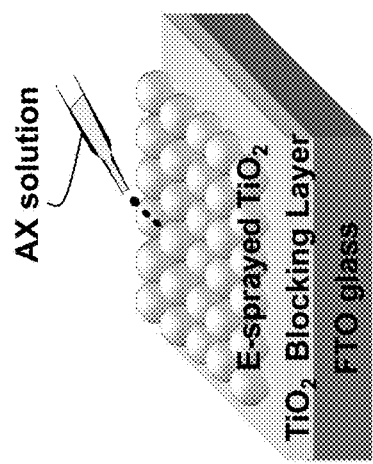
Figure 14A:
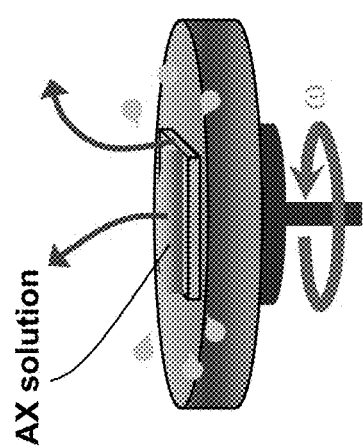

FIGS. 14A-C illustrate methods of treating the electron transporting layer with a first perovskite precursor compound, e.g., AX. The treatment method involved either spin-coating a solution of the first perovskite precursor compound onto the electron transporting layer (A), drop casting a solution of the first perovskite precursor compound onto the electron transporting layer (B) or electrospraying a solution of the first perovskite precursor compound onto the electron transporting layer (C), followed by annealing in air or non-reactive gas ambient at an annealing temperature (e.g., between about room temperature and about 500° C.) for an annealing time. All manipulations were performed in air unless otherwise noted. The AX compound was either cesium iodide (CsI, 99.9%), cesium bromide (CsBr, 99.9%), cesium chloride (CsCl, 99.9%), cesium fluoride (CsF, 99.9%), rubidium iodide (RbI, 99.9%), rubidium bromide (RbBr, 99.7%), rubidium chloride (RbCl, 99.5%), or rubidium fluoride (RbF, 99.8%). The AX compound was dissolved in water, DMF, isopropyl alcohol (IPA) or ethanol (EtOH) to form a solution. The weight (wt) % of the AX compound in the solution was in the range of from about 0.1 wt % to about 20 wt %. As shown in FIGS. 15 A-F, SEM images of the treated electron transporting layer show that the crystal morphology of the $TiO_2$ layer changes as a function of annealing temperature: room temperature (A), 100° C. (B), 200° C. (C), 300° C. (D), 400° C. (E), 500° C. (F). FIG. 15D is an optimal morphology.

Figure 16:
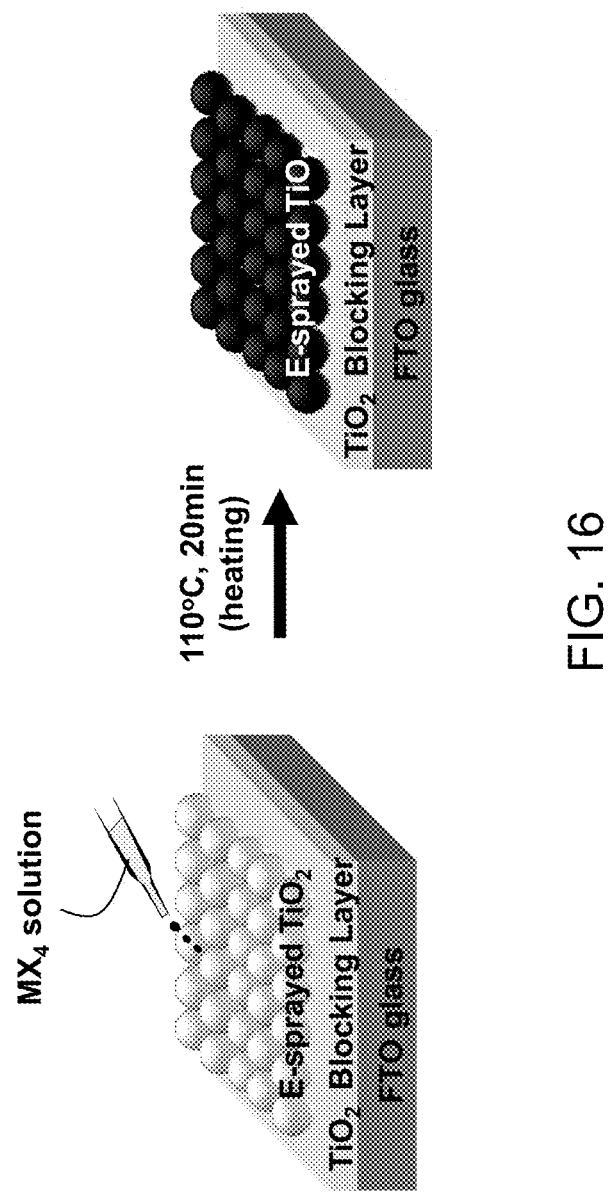
FIG. 16 illustrates a method of exposing the treated electron transporting layer of FIGS. 14A-C to a second perovskite precursor (e.g., $MX_4$) to form the perovskite light sensitizing layer according to an illustrative embodiment.

FIG. 16 illustrates a method of exposing the treated electron transporting layer to a second perovskite precursor compound, e.g., $MX_4$, to form the perovskite of the light sensitizing layer, e.g., $A_2MX_6$. A solution of the second perovskite precursor compound was drop cast onto the treated electron transporting layer of FIGS. 14A-C, followed by annealing at an annealing temperature (e.g., 110° C.) for an annealing time (e.g., 20 min) to form the perovskite. FIGS. 17A-F show SEM images of the perovskite light sensitizing layer formed over the treated electron transporting layers of FIGS. 15A-F, respectively.

Evaporation method was used to form a layer of metal (e.g., Pt or Au) or graphite over the hole transporting layer.

Figure 18:
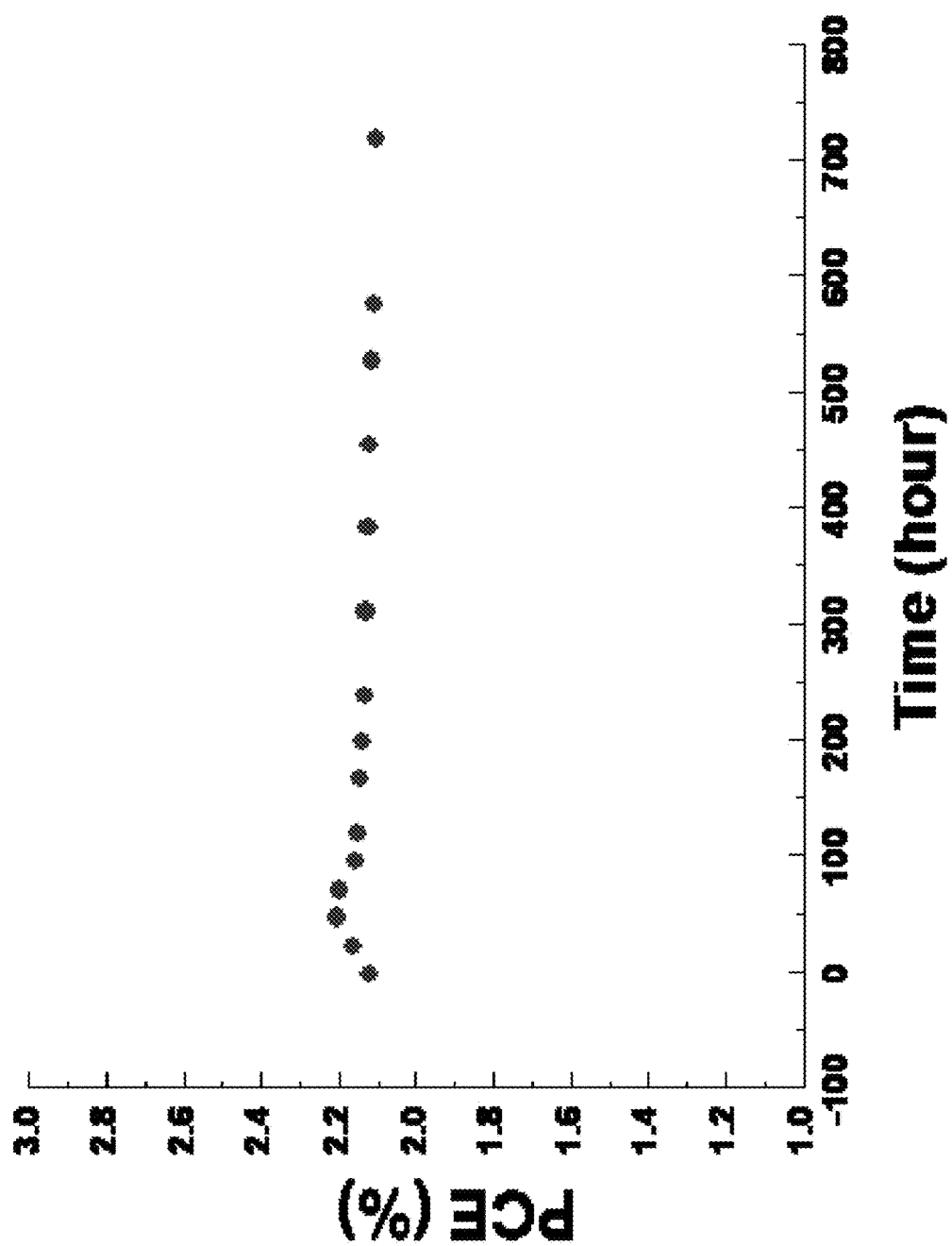
FIG. 18 shows the stability curve for a solar cell according to an illustrative embodiment.

FIG. 18 shows the stability curve for one of the solar cells.

Example 13—Solar Cells Comprising $A_2MX_6$ Perovskite Light Sensitizing Layers

Solar cells comprising $A_2MX_6$ perovskite light sensitizing layers were made. A schematic of the solar cells made is shown in FIG. 11. Solar cells having Type I, II and III configurations were made. For solar cells comprising doped or undoped mesoporous electron transporting layers, the methods of forming the layers followed that outlined in Example 12.

Two methods were used to form the perovskite light sensitizing layers. In a one-step procedure, high quality single crystals of the desired $A_2MX_6$ perovskite were dissolved in DMF at room temperature. The weight % of the $A_2MX_6$ perovskite was adjusted, e.g., between about 1 wt % to about 10 wt %. This solution was then electrosprayed onto the electron transporting layer. In a two-step procedure, first, the desired first perovskite precursor AX was dissolved in an appropriate solvent to form a first solution which was electrosprayed onto the electron transporting layer. Second, the desired second perovskite precursor $MX_4$ was dissolved in an appropriate solvent to form a second solution which was either drop cast or electrosprayed onto the AX-treated electron transporting layer for reaction to form the desired $A_2MX_6$ perovskite.

The quality of the $A_2MX_6$ perovskite film crystal morphology and property is directly related performance of the solar cell during assembly. To this end, post-film annealing was performed to improve $A_2MX_6$ crystal morphology and to correlate that to the performance of the solar cell. A series of annealing temperatures were used. SEM images of the annealed $A_2MX_6$ perovskite films were obtained and were similar to those shown in FIG. 17A-F. The optimum annealing temperature was found to be 300° C. for the case of the two-step procedure. This temperature depends on other parameters involved in the film preparation, so the optimum annealing temperature may change for different films.

Figure 22A:
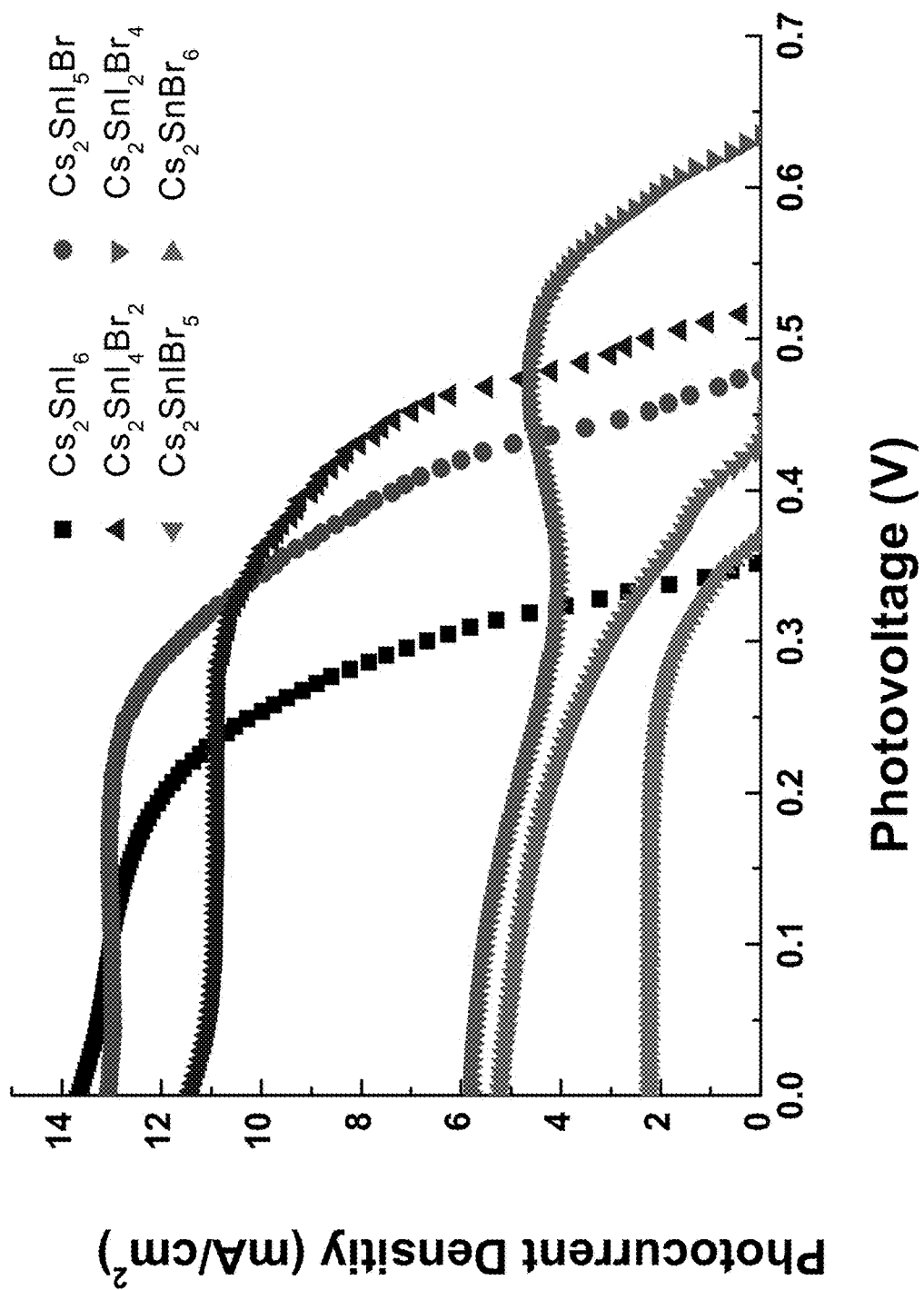
FIGS. 22A-B show the solar performance of solar cells comprising perovskite light sensitizing layers.
Figure 22B:
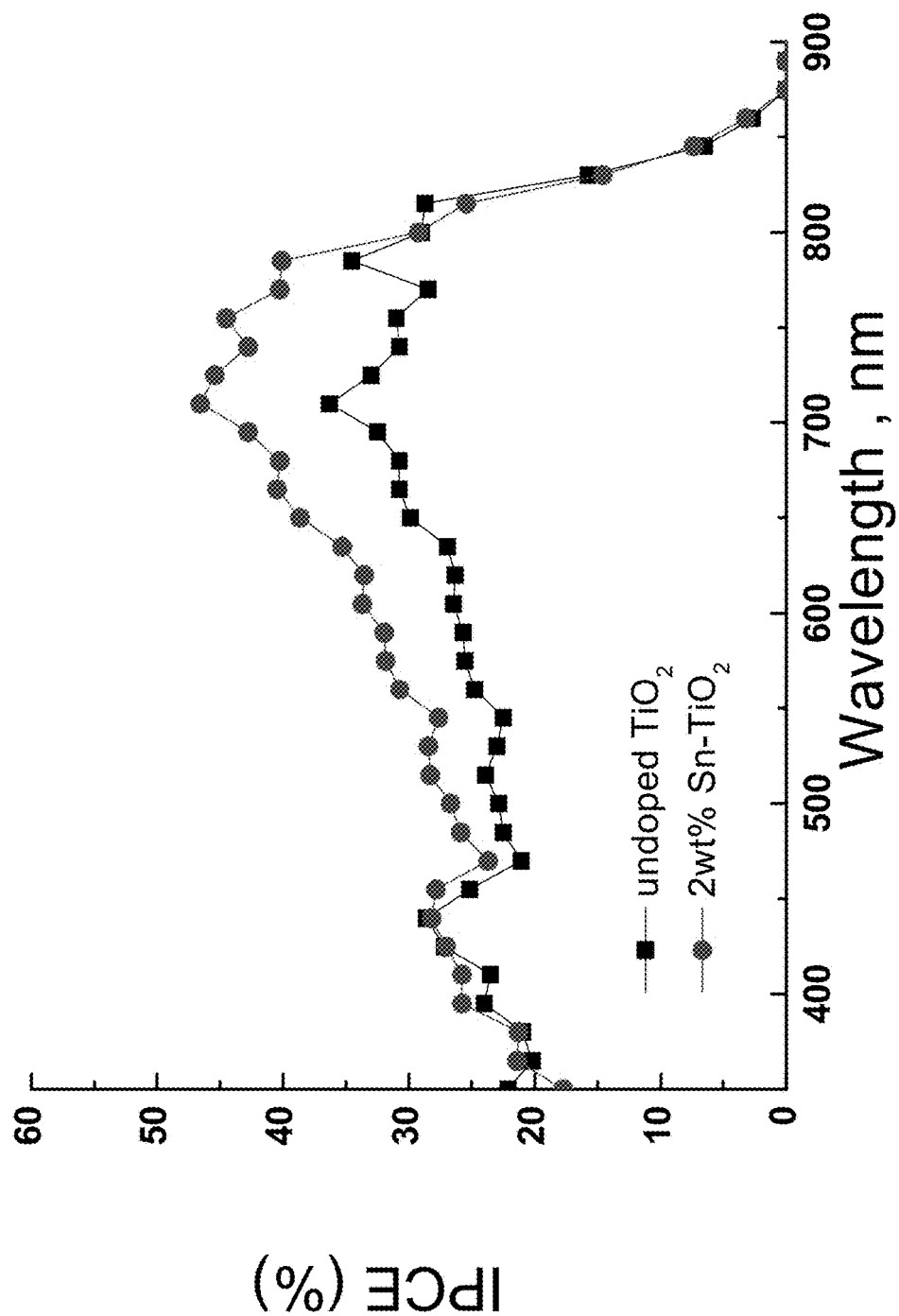

To improve the band alignment of the layers for solar cells comprising $Cs_2SnI_6$, the following strategies were adopted. First, $TiO_2$ electron transporting layers were doped with Sn to lower the relative work function on the anode side. Second, the bandgap of the $A_2MX_6$ perovskite was widened by incorporating Br into the $A_2MX_6$ perovskite. The solar cell efficiency improved to 3.62%. Table 9, below, compares the JV characteristics for the solar cells having different amounts of Br. FIGS. 22A and 22B further illustrate the solar performance of the solar cells made in this Example.

TABLE 9

JV characteristics for solar cells comprising $Cs_2SnBr_xI_{6-x}$ perovskite light sensitizing layers and Sn-doped $TiO_2$ electron transporting layers.

| Reaction | Expected Compound | Calculated Band Gap (eV) | $V_{oc}$ (v) | $J_{sc}$ (mA/cm$^2$) | FF (%) | Eff (%) |
|---|---|---|---|---|---|---|
| CsI + CsI + SnI$_4$ | Cs$_2$SnI$_6$ | 1.30 | 0.352 | 13.7 | 53.4 | 2.57 |
| CsI + CsBr + SnI$_4$ | Cs$_2$SnI$_5$Br | 1.375 | 0.480 | 13.08 | 56.1 | 3.52 |
| CsBr + CsBr + SnI$_4$ | Cs$_2$SnI$_4$Br$_2$ | 1.40 | 0.519 | 11.44 | 60.9 | 3.62 |
| CsI + CsI + SnBr$_4$ | Cs$_2$SnI$_2$Br$_4$ | 1.63 | 0.634 | 5.82 | 61.9 | 2.28 |
| CsI + CsBr + SnBr$_4$ | Cs$_2$SnIBr$_5$ | 2.24 | 0.433 | 5.23 | 41.5 | 0.94 |
| CsBr + CsBr + SnBr$_4$ | Cs$_2$SnBr$_6$ | 2.58 | 0.370 | 2.23 | 63.7 | 0.52 |

Figure 23:
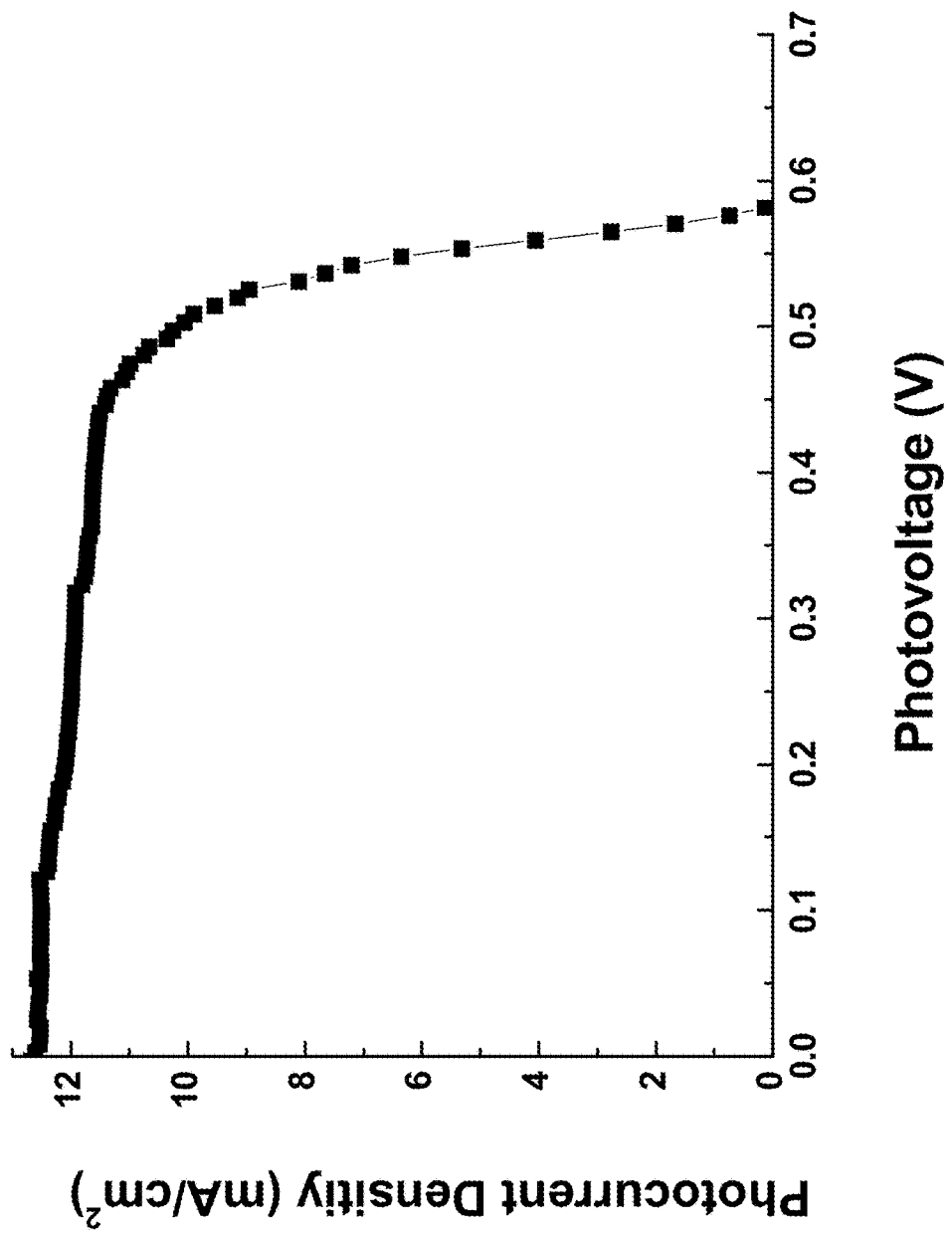
FIG. 23 shows the JV characteristic for a solar cell assembled using a dual, bottom-up/top-down approach according to an illustrative embodiment.

To assemble the final solar cells, two different approaches were adopted. In a dual, bottom-up/top-down approach, two portions of the solar cell were made separately and then sandwiched together to form the complete solar cell. The layer structure of one solar cell made according to this approach was as follows: FTO glass/$TiO_2$ electron transporting layer/$Cs_2SnBr_xI_{6-x}$ perovskite light sensitizing layer/hole transporting layer (LPAH)/graphite electrode. A first portion of the solar cell was made by forming the $TiO_2$ electron transporting layer on the FTO glass as described above and subsequently forming the $Cs_2SnBr_xI_{6-x}$ perovskite light sensitizing layer on the $TiO_2$ electron transporting layer as described above. A second portion of the solar cell was made by electrospraying a layer of LPAH on the graphite electrode. The two portions of the solar cell were subsequently sandwiched together. The JV characteristic of the solar cell is shown in FIG. 23. The solar cell may further comprise a contact layer, e.g., formed on the LPAH-coated graphite electrode for smoothing the interface between the perovskites light sensitizing layer and the hole transporting layer.

Figure 24:
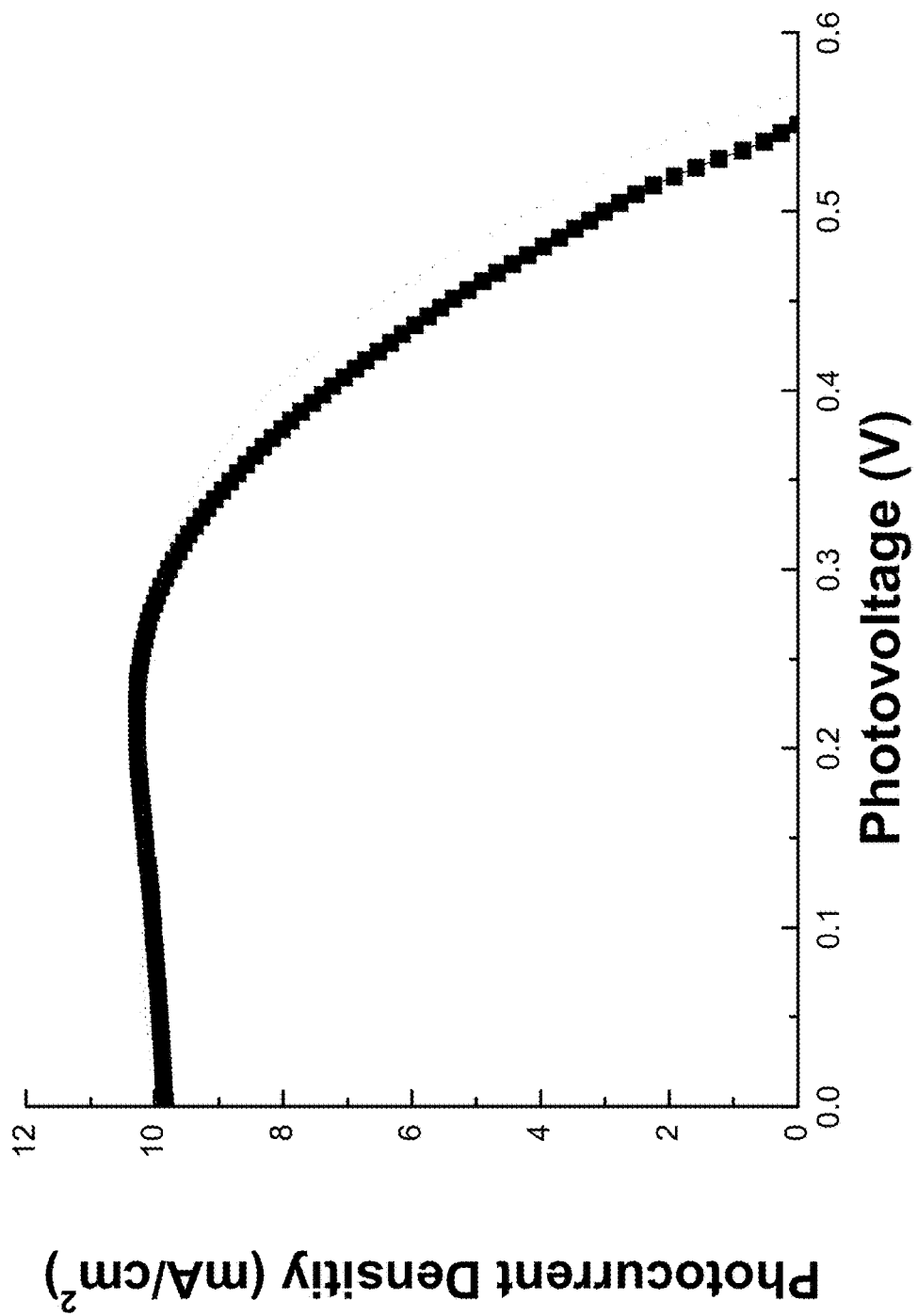
FIG. 24 shows the JV characteristic for a solar cell assembled using a bottom-up approach according to an illustrative embodiment.

In a bottom-up approach, each layer of the solar cell was deposited sequentially, one on top of the other. The layer structure of one solar cell made according to this approach was as follows: FTO glass/$TiO_2$ electron transporting layer/$Cs_2SnBr_xI_{6-x}$ perovskite light sensitizing layer/hole transporting layer (Spiro-OMeTAD or porous LPAH)/metal or graphite. Starting from the FTO glass, each of the remaining layers were deposited sequentially, one on top of the other, ending at the metal or graphite electrode. The JV characteristic of the solar cell is shown in FIG. 24. Table 10, below, compares the JV characteristics of the two solar cells. As can be seen, the solar cell made using the dual, bottom-up/top-down approach has a much higher efficiency. The solar cells were very stable (within a few % efficiency variation) in ambient atmosphere for over 800 hours of testing.

TABLE 10

JV characteristics for solar cells comprising $Cs_2SnBr_xI_{6-x}$ perovskitelight sensitizing layers assembled according to a dual, bottom-up/top-down approach or a bottom-up approach.

| Solar Cell Structure | JV characteristics | | | |
|---|---|---|---|---|
| | $V_{OC}$ (V) | $J_{SC}$ (mA/cm$^2$) | FF (%) | EFF (%) |
| Dual, bottom-up/top-down | 0.584 | 12.6 | 70.6 | 5.21 |
| Bottom-up | 0.548 | 9.830 | 57.2 | 3.08 |

What is claimed is:

1. A method of making a perovskite sensitizing layer, the method comprising electrospraying a solution comprising a perovskite on the surface of an electron transporting layer, and heating the perovskite sensitizing layer at a temperature for a time, wherein the perovskite sensitizing layer is formed on the surface of the electron transporting layer, wherein the perovskite has a formula selected from the group consisting of $A_2MX_6$, $Z_2MX_6$ and $YMX_6$,
   wherein A is an alkali metal,
   M is a metal or a metalloid,
   X is a halide,
   Z is selected from the group consisting of a primary ammonium, an iminium, a secondary ammonium, a tertiary ammonium, and a quaternary ammonium, and
   Y has formula $M_b(L)_3$, wherein $M_b$ is a transition metal in the 2+ oxidation state L is an N—N neutral chelating ligand.

2. A method of making a perovskite sensitizing layer, the method comprising:

(a) exposing an electron transporting layer to a first solution comprising a first perovskite precursor to form a first coating on the surface of the electron transporting layer and heating the coated electron transporting layer at a first temperature for a first time; and (b) exposing the coated electron transporting layer to a second solution comprising a second perovskite precursor to form a second coating over the surface of the electron transporting layer and heating the coated electron transporting layer at a second temperature for a second time, wherein the perovskite sensitizing layer is formed on the surface of the electron transporting layer, wherein the perovskite has a formula selected from the group consisting of $A_2MX_6$, $Z_2MX_6$ and $YMX_6$, wherein A is an alkali metal, M is a metal or a metalloid, X is a halide, Z is selected from the group consisting of a primary ammonium, an iminium, a secondary ammonium, a tertiary ammonium, and a quaternary ammonium, and Y has formula $M_b(L)_3$, wherein $M_b$ is a transition metal in the 2+ oxidation state L is an N—N neutral chelating ligand.

3. The method of claim 2, wherein the first perovskite precursor is selected from the group consisting of AX, ZX and $YX_2$; and further wherein the second perovskite precursor is $MX_4$.

4. The method of claim 1, wherein the perovskite has the formula $A_2MX_6$.

5. The method of claim 4, wherein the electron transporting layer is a mesoporous electron transporting layer comprising nanostructures that define pores.

6. The method of claim 5, wherein the perovskite sensitizing layer is sufficiently thin that it does not fill the pores of the electron transporting layer.

7. The method of claim 4, wherein the perovskite comprises $Cs_2SnI_6$.

8. The method of claim 1, wherein the perovskite has the formula $Z_2MX_6$.

9. The method of claim 1, wherein the perovskite has the formula $YMX_6$.

10. The method of claim 3, wherein the perovskite has the formula $A_2MX_6$.

11. The method of claim 10, wherein the electron transporting layer is a mesoporous electron transporting layer comprising nanostructures that define pores.

12. The method of claim 11, wherein the perovskite sensitizing layer is sufficiently thin that it does not fill the pores of the electron transporting layer.

13. The method of claim 11, wherein the first perovskite precursor has the formula AX and the second perovskite precursor has the formula $MX_4$, wherein A is an alkali metal, M is a metal or a metalloid, and X is a halide.

14. The method of claim 13, wherein AX is CsI, $MX_4$ is $SnI_4$, and the perovskite is $Cs_2SnI_6$.

15. The method of claim 2, wherein the electron transporting layer is a mesoporous electron transporting layer comprising nanostructures that define pores.

16. The method of claim 15, wherein the perovskite sensitizing layer is sufficiently thin that it does not fill the pores of the electron transporting layer.

17. The method of claim 3, wherein the perovskite has the formula $Z_2MX_6$.

18. The method of claim 17, wherein the first perovskite precursor has the formula ZX and the second perovskite precursor has the formula $MX_4$, wherein M is a metal or a metalloid, X is a halide, and Z is selected from the group consisting of a primary ammonium, an iminium, a secondary ammonium, a tertiary ammonium, and a quaternary ammonium.

19. The method of claim 3, wherein the perovskite has the formula $YMX_6$.

20. The method of claim 19, wherein the first perovskite precursor has the formula $YX_2$ and the second perovskite precursor has the formula $MX_4$, wherein M is a metal or a metalloid, X is a halide, and Y has formula $M_b(L)_3$, wherein $M_b$ is a transition metal in the 2+ oxidation state L is an N—N neutral chelating ligand.

* * * * *